United States Patent
Linnell et al.

(10) Patent No.: US 9,308,647 B2
(45) Date of Patent: Apr. 12, 2016

(54) SYSTEMS AND METHODS FOR INSTRUCTING ROBOTIC OPERATION

(71) Applicant: Bot & Dolly, LLC, San Francisco, CA (US)

(72) Inventors: Jeffrey Linnell, Woodside, CA (US); Kendra Byrne, San Francisco, CA (US)

(73) Assignee: BOT & DOLLY, LLC, San Francisco, CA (US)

( * ) Notice: Subject to any disclaimer, the term of this patent is extended or adjusted under 35 U.S.C. 154(b) by 0 days.

(21) Appl. No.: 14/295,168

(22) Filed: Jun. 3, 2014

(65) Prior Publication Data

US 2015/0343635 A1    Dec. 3, 2015

(51) Int. Cl.
| | |
|---|---|
| *B25J 9/16* | (2006.01) |
| *G06N 3/00* | (2006.01) |
| *G06F 17/50* | (2006.01) |

(Continued)

(52) U.S. Cl.
CPC .............. *B25J 9/1671* (2013.01); *B25J 9/1656* (2013.01); *B25J 9/1661* (2013.01); *G06N 3/006* (2013.01); *G06N 3/008* (2013.01); *B25J 11/00* (2013.01); *G05B 2219/31467* (2013.01); *G05B 2219/31472* (2013.01); *G05B 2219/32342* (2013.01);

(Continued)

(58) Field of Classification Search
CPC ........ B25J 9/1671; B25J 11/00; B25J 9/1656; B25J 9/1661; G05B 2219/32351; G05B 2219/31467; G05B 2219/31472; G05B 2219/32342; G06N 3/008; G06N 3/006; G06F 17/5009; G06T 13/40

USPC .......................................................... 700/249
See application file for complete search history.

(56) References Cited

U.S. PATENT DOCUMENTS

| | | | |
|---|---|---|---|
| 5,950,006 A | 9/1999 | Crater et al. | |
| 6,161,051 A | 12/2000 | Hafemann et al. | |

(Continued)

FOREIGN PATENT DOCUMENTS

| | | |
|---|---|---|
| DE | 2010004476 | 7/2011 |
| WO | 2014/003864 | 1/2014 |

OTHER PUBLICATIONS

Bengtsson, K. et al., "Sequence Planning Using Multiple and Coordinated Sequences of Operations," IEEE Transactions on Automation Science and Engineering, 2012, pp. 308-319, vol. 9, No. 2.

(Continued)

*Primary Examiner* — Jason Holloway
(74) *Attorney, Agent, or Firm* — McDonnell Boehnen Hulbert & Berghoff LLP

(57) ABSTRACT

Example systems and methods may allow for use of a generic robot trajectory format to control a robotic process within a workcell. One example method includes receiving a digital representation of at least one digital robot actor, including at least one robot definition corresponding to the at least one digital robot actor and at least one sequence of robot operations for the at least one digital robot actor, determining a mapping between the at least one digital robot actor and at least one corresponding physical robot actor within a physical workcell, generating at least one robot-language-specific sequence of executable instructions for the at least one physical robot actor, and transmitting the at least one robot-language specific sequence of executable instructions to the at least one physical robot actor to execute in order to perform the at least sequence of robot operations within the physical workcell.

20 Claims, 17 Drawing Sheets

(51) Int. Cl.
*B25J 11/00* (2006.01)
*G06T 13/40* (2011.01)

(52) U.S. Cl.
CPC ... *G05B2219/32351* (2013.01); *G06F 17/5009* (2013.01); *G06T 13/40* (2013.01)

(56) References Cited

U.S. PATENT DOCUMENTS

| | | | |
|---|---|---|---|
| 6,522,951 | B2 | 2/2003 | Born et al. |
| 6,718,533 | B1 | 4/2004 | Schneider et al. |
| 7,298,385 | B2 | 11/2007 | Kazi et al. |
| 7,542,918 | B2 | 6/2009 | Rolleston Phillips |
| 7,590,680 | B2 | 9/2009 | Fernando et al. |
| 7,890,194 | B2 | 2/2011 | Pannese |
| 7,945,348 | B2 | 5/2011 | Pannese et al. |
| 8,073,567 | B2 | 12/2011 | Nishi et al. |
| 8,082,769 | B2 | 12/2011 | Butscher et al. |
| 8,229,587 | B2 | 7/2012 | Shieh et al. |
| 8,483,881 | B2 | 7/2013 | Ermakov et al. |
| 8,614,559 | B2 | 12/2013 | Kassow et al. |
| 8,639,666 | B2 | 1/2014 | Densham et al. |
| 8,660,738 | B2 | 2/2014 | Faivre et al. |
| 9,056,396 | B1 * | 6/2015 | Linnell .................. B25J 9/1697 |
| 2001/0004718 | A1 | 6/2001 | Gilliland et al. |
| 2003/0171842 | A1 | 9/2003 | Teramoto |
| 2005/0119791 | A1 | 6/2005 | Nagashima |
| 2006/0145647 | A1 | 7/2006 | Kitatsuji et al. |
| 2006/0200254 | A1 | 9/2006 | Krause |
| 2006/0276934 | A1 | 12/2006 | Nihei et al. |
| 2008/0014058 | A1 | 1/2008 | Hongkham et al. |
| 2009/0112350 | A1 | 4/2009 | Yuan et al. |
| 2010/0082345 | A1 * | 4/2010 | Wang ...................... G10L 13/00 704/260 |
| 2010/0312387 | A1 | 12/2010 | Jang et al. |
| 2010/0332017 | A1 | 12/2010 | Stummer |
| 2011/0087354 | A1 * | 4/2011 | Tye .......................... A63H 9/00 700/98 |
| 2011/0295391 | A1 * | 12/2011 | Schneider ................. G06F 8/34 700/87 |
| 2012/0072019 | A1 | 3/2012 | Sanders et al. |
| 2012/0188350 | A1 | 7/2012 | Hammond et al. |
| 2012/0215354 | A1 * | 8/2012 | Krasny .................. B25J 9/1666 700/255 |
| 2012/0307027 | A1 * | 12/2012 | Popovic ............. A61B 19/2203 348/65 |
| 2013/0141431 | A1 * | 6/2013 | Kawakami ............. G06T 13/40 345/419 |
| 2013/0331959 | A1 | 12/2013 | Kawai |
| 2014/0088949 | A1 * | 3/2014 | Moriya ............... G06F 17/5009 703/22 |
| 2014/0285482 | A1 * | 9/2014 | Kim ........................ G06T 13/40 345/419 |
| 2014/0303778 | A1 * | 10/2014 | Shuster .................. G06T 17/00 700/264 |

OTHER PUBLICATIONS

Chen et al., "Simulation and Graphical Interface for Programming and Visualization of Sensor-based Robot Operation," Proceedings of the 1992 IEEE International Conference on Robotics and Automation, Nice, France, May 1992, pp. 1095-2110.

El-Hakim, "A system for indoor 3-d mapping and virtual environments," Proceedings of the SPIE—The International Society for Optical Engineering, 1997, pp. 21-35, vol. 3174.

Li et al., "Fuzzy Target Tracking Control of Autonomous Mobile Robots by Using Infrared Sensors," IEEE Transactions on Fuzzy Systems, Aug. 2004, pp. 491-501, vol. 12, No. 4.

Roll Jr. et al., "Targeting and sequencing algorithms for the Hectospec's optical fiber robotic positioner,"Proceedings of the SPIE—The International Society for Optical Engineering, 1998, pp. 324-332, vol. 3355.

Sanhoury et al., "Switching between formations for multiple mobile robots via synchronous controller," 2012 IEEE 8th International Colloquium on Signal Processing and its Applications (CSPA), 2012, pp. 352-357.

Zhang, Peng, "Chapter 3—System Interfaces for Industrial Control," Industrial Control Technology: A Handbook for Engineers and Researchers, 2008, pp. 259-427.

PCT International Search Report, International application No. PCT/ 2015/028528, International filing date Apr. 30, 2015 (11 pages).

Blume C et al, "Alle Roboter Verstehen Die Gleiche Sprache", Elektronik, W E K A Fachzeitshriften-Verlag Gmbh, De, vol. 41, No. 20, Sep. 29, 1992, pp. 116, 119-123, XP000311742, ISSN: 0013-5658.

Blume C et al, "Alle Roboter Verstehen Die Gleiche Sprache. \TEIL2: National Und Internationale Normungs-Bestrebungen Fuer Den Steuercode", Elektronik, W E K A Fachzeitschriften-Verlag GMBH, DE, vol. 41, No. 21, Oct. 13, 1992, pp. 72-74,76, XP000319900, ISSN:0013-5658 (4 pages).

* cited by examiner

FIG. 9

SYSTEMS AND METHODS FOR INSTRUCTING ROBOTIC OPERATION

BACKGROUND

Unless otherwise indicated herein, the materials described in this section are not prior art to the claims in this application and are not admitted to be prior art by inclusion in this section.

Automated manufacturing processes may involve the use of one or more robotic devices that may be used to construct an output product, such as a car, a wall, a piece of furniture, or any number of other physical fabrications. The robotic devices may be equipped with end-effector-mounted tools, such as a gripper or a drill, that may be used during a construction process. The robotic devices may be programmed with sequences of specific motion commands and commands for other operations in order to cause the robotic devices to complete a manufacturing process.

SUMMARY

The present disclosure provides methods and apparatuses that may help to allow for use of a generic robot trajectory format in order to control a robotic process within a workcell. In particular, a generic robot code file may be generated that contains a description of digital robot actors as well robot operations for each digital robot actor to execute. A control system may receive the generic robot code file and determine a mapping between the digital robot actors and corresponding physical robot actors within a workcell. Robot-language-specific executable instructions may be generated for the physical robot actors to enable the robot actors to perform the robot operations from the generic robot code file. The physical robot actors may then be controlled to execute the instructions within a physical workcell.

In one example, a method is provided that includes receiving, by a computer device, a digital representation of at least one digital robot actor. The digital representation may include (a) at least one robot definition corresponding to the at least one digital robot actor, where the at least one robot definition includes at least one IO device operable by the at least one digital robot actor, and (b) at least one sequence of robot operations for the at least one digital robot actor, where a sequence of robot operations for a digital robot actor comprises a plurality of robot movements and a plurality of IO triggers to activate one or more of the at least one IO device. The method may further include determining a mapping between the at least one digital robot actor and at least one corresponding physical robot actor within a physical workcell. The method may also include generating at least one robot-language-specific sequence of executable instructions for the at least one physical robot actor based on the at least one sequence of robot operations for the at least one corresponding digital robot actor. The method may additionally include transmitting the at least one robot-language-specific sequence of executable instructions to the at least one physical robot actor to execute in order to perform the at least one sequence of robot operations within the physical workcell.

In a further example, a system including at least one physical robot actor and a control system is disclosed. The control system may be configured to receive a digital representation of at least digital robot actor. The digital representation may include (a) at least one robot definition corresponding to the at least one digital robot actor, where the at least one robot definition includes at least one IO device operable by the at least one digital robot actor, and (b) at least one sequence of robot operations for the at least one digital robot actor, where a sequence of robot operations for a digital robot actor includes a plurality of robot movements and a plurality of IO triggers to activate one or more of the at least one IO device. The control system may be further configured to determine a mapping between the at least one digital robot actor and the at least one physical robot actor. The control system may also be configured to determine at least one robot-language-specific sequence of executable instructions for the at least one physical robot actor based on the at least one sequence of robot operations for the at least one digital robot actor. The control system may also be configured to transmit the at least one robot-language-specific sequence of executable instructions to the at least one physical robot actor to execute in order to perform the at least one sequence of robot operations.

In another example, a non-transitory computer readable medium having stored therein instructions, that when executed by a computing device, cause the computing device to perform functions is disclosed. The functions may include receiving a digital representation of at least one digital robot actor. The digital representation may include (a) at least one robot definition corresponding to the at least one digital robot actor, where the at least one robot definition includes at least one IO device operable by the at least one digital robot actor, and (b) at least one sequence of robot operations for the at least one digital robot actor, where a sequence of robot operations for a digital robot actor comprises a plurality of robot movements and a plurality of IO triggers to activate one or more of the at least one IO device. The functions may further include determining a mapping between the at least one digital robot actor and at least one corresponding physical robot actor within a physical workcell. The functions may also include generating at least one robot-language-specific sequence of executable instructions for the at least one physical robot actor based on the at least one sequence of robot operations for the at least one corresponding digital robot actor. The functions may additionally include transmitting the at least one robot-language-specific sequence of executable instructions to the at least one physical robot actor to execute in order to perform the at least one sequence of robot operations within the physical workcell.

In yet another example, a system may include means for receiving a digital representation of at least one digital robot actor. The digital representation may include (a) at least one robot definition corresponding to the at least one digital robot actor, where the at least one robot definition includes at least one IO device operable by the at least one digital robot actor, and (b) at least one sequence of robot operations for the at least one digital robot actor, where a sequence of robot operations for a digital robot actor comprises a plurality of robot movements and a plurality of IO triggers to activate one or more of the at least one IO device. The system may further include means for determining a mapping between the at least one digital robot actor and at least one corresponding physical robot actor within a physical workcell. The system may also include means for determining at least one robot-language-specific sequence of executable instructions for the at least one physical robot actor based on the at least one sequence of robot operations for the at least one corresponding digital robot actor. The system may additionally include means for transmitting the at least one robot-language-specific sequence of executable instructions to the at least one physical robot actor in order to perform the at least one sequence of robot operations within the physical workcell.

The foregoing summary is illustrative only and is not intended to be in any way limiting. In addition to the illustrative aspects, embodiments, and features described above, further aspects, embodiments, and features will become apparent by reference to the figures and the following detailed description and the accompanying drawings.

BRIEF DESCRIPTION OF THE DRAWINGS

FIG. 9 shows an example generic robot trajectory format file, according to an example embodiment.

DETAILED DESCRIPTION

Figure 1:
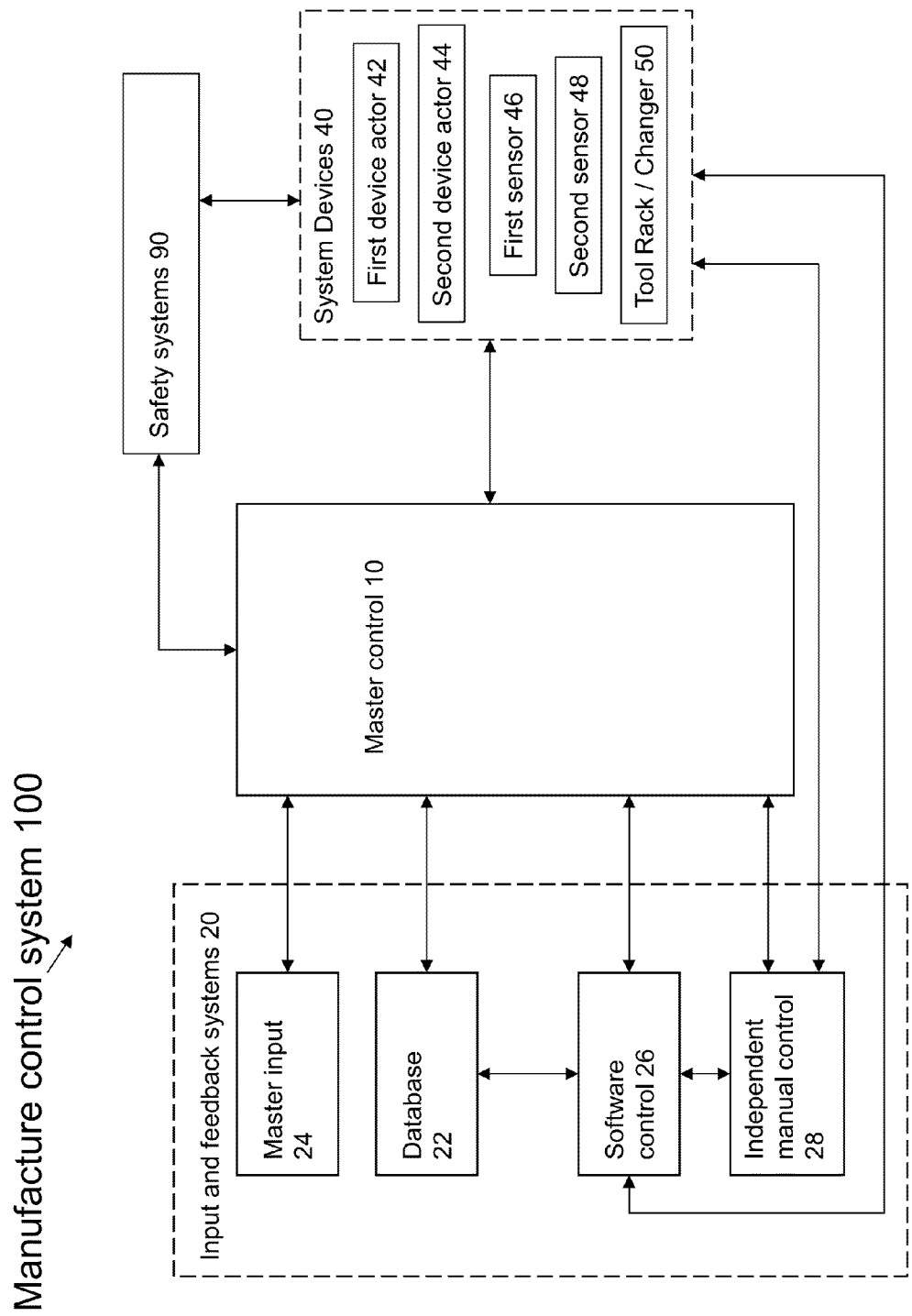
FIG. 1 shows a block diagram of a manufacture control system, according to an example embodiment.

Example methods and systems are described herein. Any example embodiment or feature described herein is not necessarily to be construed as preferred or advantageous over other embodiments or features. The example embodiments described herein are not meant to be limiting. It will be readily understood that certain aspects of the disclosed systems and methods can be arranged and combined in a wide variety of different configurations, all of which are contemplated herein.

Furthermore, the particular arrangements shown in the Figures should not be viewed as limiting. It should be understood that other embodiments might include more or less of each element shown in a given Figure. Further, some of the illustrated elements may be combined or omitted. Yet further, an example embodiment may include elements that are not illustrated in the Figures.

I. Overview

Example systems may employ a generic robot trajectory format that may help to allow for control of different types of industrial robotic devices within a physical workcell. An example generic robot trajectory format file may encapsulate parameters to describe both the types of robot actors to be controlled as well as their trajectory and state at any given step along a sequence of motions and/or at points along a timeline. Further, the file may describe both where a given robot actor should be and what the robot actor should be doing at particular points to execute a coordinated process within the physical world, such as a manufacturing process to construct an output product. In additional examples, the trajectory format may be used by a system that allows different types of robots from multiple manufacturers to be programmed within a single software environment and controlled via a shared hardware environment.

Within examples, a generic robot trajectory format file may contain one or more robot definitions that describe one or more digital robot actors. A robot definition may contain information about a particular robot actor, including the types of input/output (IO) devices that can be used by the robot actor. In further examples, a robot definition may also contain an initial pose for the robot actor describing the initial robot positioning before a process is started.

Additionally, the generic robot trajectory format file may contain a digital representation of sequences of robot movements for each robotic actor to execute. Within the motion paths, the file may further describe a number of different IO triggers (e.g., to activate an end-effector-mounted tool such as a gripper) at certain points within the motion path of a robot actor. In some examples, in addition to motion commands and IO triggers, an example robot trajectory format may contain metadata describing additional information associated with particular points in a robot's motion path. For instance, particular points may be identified as sync points that require an interlock between all the robot actors before the robot actors can continue executing operations. In further examples, a file may also describe IO triggers for standalone devices, such as to activate a turntable within the workcell at a particular point while executing a process.

In order to perform the robot operations from a generic robot trajectory format file within a physical workcell, digital robot actors defined within the file may first be mapped to corresponding physical robot actors within the workcell. In some examples, a control system may determine this mapping using a separate stage file. An example stage file may contain descriptions of available robotic devices and/or other hardware devices within a workcell. For instance, the stage file may contain parameters describing robot actors, tools, tool changers, and/or sensors within a workcell.

In additional examples, a control system may use the stage file to determine available physical robot actors that are capable of performing robot operations for corresponding digital robot actors. The mapping may also map other types of devices (e.g., IO devices) between the generic robot trajectory format file and the physical workcell. In other examples, the mapping between digital robot actors and physical robot actors may be determined in other ways. For instance, a user may be presented with a dropdown menu listing available robot actors within a display of a computing device in order to select which physical robot actor within a workcell should execute which set of operations from the generic robot trajectory format file.

In additional examples, a conversion service may be provided to generate executable instructions from the generic robot trajectory format, resulting in machine code for particular types of robotic devices. In some examples, a validation process may first be used in order to verify that the robot actors (and possibly other hardware devices) within a physical workcell are capable of performing the sets of robot operations from the generic robot trajectory format file within a particular physical workcell. After verifying that the robotic process can be completed within a workcell, robot-language-specific instructions may be generated for the particular types of devices within the workcell. The robot-language-specific instructions may then be transmitted to the devices for execution.

In further examples, a generic robot trajectory format may also be used by a higher-level controller that receives information from robot actors and/or other hardware devices within a physical workcell during execution. In particular, the format may support conditional statements that can only be resolved during runtime using information from the workcell. For example, the controller may use the state of one or more robot actors within the workcell to determine whether to perform a particular operation or how to select from several different operations. In other examples, the controller may use sensor data from sensors within the workcell in order to resolve conditional statements as well or instead.

In further examples, a generic robot trajectory format may support both procedural (e.g., sequential) and parallel (e.g., time-based) execution of robot motions and other operations. For instance, sections of a generic robot trajectory format file may be annotated to indicate whether the section describes sequential or time-based execution. In sequential sections of code, robot trajectories and other events may be described sequentially as ordered sequences of target frames and IO triggers. In time-based sections of code, robot trajectories and other events may be described at corresponding points along a global timeline using a certain time interval (e.g., 12 ms). At the point of compilation, a control system may evaluate whether a motion sequence is designed for a parallel or procedural execution environment (or some of both), as well as the appropriate machine program language for each robot actor, in order to transmit instructions to devices within a workcell.

II. Example Control Systems

Example embodiments may provide for motion planning and control of multi-axis robotic systems for use in the manufacturing and making industries. Example design-to-production systems may allow users to change parameters describing an output product on the front end, with the effects propagated though to a product manufactured by one or more robotic devices using one or more tools. In some examples, users may be provided with a graphical interface that allows for the configuration of the robot actors using a diverse toolset in order to automate the building process. In further examples, robot motions may be abstracted so that users don't have to program specific robot commands (e.g., motion commands or tool commands) in order to control the building process. Accordingly, users may be able to design a building process without specific knowledge of commands for particular types of robots. Additionally, users may be provided with one or more interfaces that allow for varying amounts of control over specific robot operations within a manufacturing process, during offline motion programming and/or during runtime.

In further examples, users may be provided with a three-dimensional (3D) modeling graphical interface that allows the user to alter one or more variables describing a physical workcell and/or a desired output product that affect a building process in the physical world. Additionally, the user interface may provide abstract ways to represent physical objects digitally as nodes within a software environment. In particular, the user experience may enable users to select from an array of tools which can be configured and combined in a number of different ways to control different types of robot actors and hardware components within a physical workcell.

In further examples, the physical workcell may include a physical stage or stages on which a physical building process is planned or is occurring within the physical world. In some examples, the physical workcell may include a variety of different robot actors and other hardware components as well as physical materials that may be used in the building process. In further examples, the physical workcell may contain a tool rack and/or an automated tool changer. In additional examples, the physical workcell may contain one or more different types of sensors. Also, the physical workcell may include any number of different dimensions, including platforms for particular building activities.

It should be understood that the present disclosure is not to be limited in terms of the particular embodiments described in this application, which are intended as illustrations of various aspects. Numerous components of example manufacturing systems are described herein. Systems that contain only some of those components or any combination of such components are contemplated as well. Many modifications and variations can be made without departing from the spirit and scope of the disclosed systems and methods. Functionally equivalent methods and apparatuses within the scope of the disclosure, in addition to those enumerated herein, will be apparent to those skilled in the art.

Example embodiments may involve use of a manufacture control system to create automated programming of robotics arms during a building process. FIG. 1 describes an example manufacture control system 100. Manufacture control system 100 may be part of a manufacturing environment used to control one or more robotic devices to use one or more tools to construct some output product. Manufacture control system 100 may comprise a master control 10, input and feedback systems 20, system devices 40, and safety systems 90. From the most basic perspective, manufacture control system 100 may function when an input system 20 provides instructions to one of system devices 40 via master control 10.

In one potential embodiment as part of a manufacture control system 100, input and feedback system 20 may include a database 22, a master input 24, a software control 26, and an independent manual control 28. As part of the input and feedback systems 20, database 22 may operate to provide a set of timing and position data to direct all or a portion of device actors 42, 44 within system devices 40. Two device actors 42, 44 are shown in FIG. 1, but any number of device actors could be used within manufacture control system 100. Alternatively, database 22 may store data being created by manual or individual movement or data input related to operation and function of device actors 42, 44. Database 22 may also store data created independently of device actors 42, 44, such as data created using software modeling features of a software control 26.

A master input 24 may be any device that functions to operate all of the device actors 42, 44 associated with a particular building process being executed by manufacture control system 100. Master input 24 may function by sending input control signals to master control 10. Master control 10 may then adapt the signal from master input 24 to send individual control signals to a plurality of robot actors operating as device actors 42, 44 for a particular manufacturing process. In one potential embodiment, every individual device of device actors 42, 44 may be provided a control signal from master control 10 when a signal is received from master input 24, including a signal to maintain a status quo or non-action to devices that are not operating as device actors 42, 44 for a particular part of the manufacturing process. In an alternative embodiment, a portion of the device actors 42, 44 connected as part of manufacture control system 100 may not be sent any signal from master control 10 as part of the operation of motion control system 100 for a particular part of the manufacturing process.

In some examples, software control 26 may act as a replacement for master input 24 in sending control signals to the plurality of device actors 42, 44 via the master control 10. Alternately, software control 26 may control individual devices from among device actors 42, 44 to control particular operations of the individual device. In other potential embodiments, software control 26 may function to model the behavior of individual devices of device actors 42, 44 within a virtual modeling environment representative of a physical workcell. In such an embodiment, software control 26 may contain a software model for an individual device, which allows control signals to be created for the device without actually sending the control signals to the device. The control signals may then be stored in the software control 26, in database 22, within a computer memory component that is part of master control 10, or within computer memory that is part of the device of device actors 42, 44 for which the controls are being created. After the control signal is created by software control 26 and propagated to the appropriate storage location, a master control signal from software control 26 or from master input 24 may activate the control signal for the individual device to act in conjunction with other device actors 42, 44.

In further examples, certain devices of device actors 42, 44 may additionally have an independent manual control 28. As described above with respect to software control 26, control signals for an individual device may be created in software modeling. In addition or instead, a device may have independent manual control 28 that may be used to operate a device of device actors 42, 44. When a set of instructions is being created for an entire manufacturing process, the independent manual control 28 may be given input commands over time that are recorded to database 22 or a memory device of master control 10. During creation of a set of instructions using independent manual control 28, the independent manual control 28 may communicate directly with the associated device of device actors 42, 44. Alternatively, the independent manual control 28 may send a control signal to master control 10, which then conveys the signal to the associated device of device actors 42, 44.

The control signal may then be created either firm the signal of the independent manual control 28 (e.g., a separate user interface), or from a measured feedback reading created by the operation of the associated device. Additionally, although in many situations, it may be preferable to have the independent manual control 28 actually control the associated device during control signal creation in real time, control signals may instead be created without controlling the device. For example, if input signals are expected for certain time marks, an independent manual control 28 may be operated independent of the related device, and the control operation may be recorded. Accordingly, instructions for individual device actors of device actors 42, 44 from independent manual control may be integrated into a building process as part of manufacture control system 100.

In further examples, master control 10 may allow for real-time control of components of a building system by providing a link between a virtual world (e.g., software control 26) and the physical world (e.g., a physical workcell containing device actors 42, 44). Accordingly, movements of a physical robot within the physical world may be used to drive the current position of a corresponding virtual robot in real time. Similarly, movements of a virtual robot may be used to drive the current position of a physical robot in the physical world as well or instead.

In one potential embodiment, individual control signals for specific device actors may be coordinated into a single file within a memory of a master control with a common base time provided by a master clock within the master control. During operation, the master control may extract control signals for each device actor and provide individual control signals to each device actor at the appropriate intervals. In an alternative embodiment, the master control may maintain separate individual control signal files and timing data for different device actors, and synchronize the different control signals separately from the individual control files.

In another alternative embodiment, the control data for a portion of the device actors may be transferred by a master control to a memory within an associated individual device actor. During operation, device actors having control data within memory may receive a synchronization signal that indicates a location in a global timeline, a rate of progress through a global timeline, or both.

Network support may also enable communications from master control 10 to one or more of system devices 40. In one potential embodiment, a network may comprise an EtherCAT network operating according to IEEE 1588. In such an embodiment, packets may be processed on the fly using a field bus memory management unit in each slave node. Each network node may read the data addressed to it, while the telegram is forwarded to the next device. Similarly, input data may be inserted while the telegram passes through. The telegrams may only be delayed by a few nanoseconds. On the master side, commercially available standard network interface cards or an on-board Ethernet controller can be used as a hardware interface. Using these interfaces, data transfer to the master control via direct memory access may be achieved with no CPU capacity taken up for the network access. The EtherCAT protocol uses an officially assigned Ether Type inside the Ethernet Frame. The use of this Ether Type may allow transport of control data directly within the Ethernet frame without redefining the standard Ethernet frame. The frame may consist of several sub-telegrams, each serving a particular memory area of the logical process images that can be up to 4 gigabytes in size. Addressing of the Ethernet terminals can be in any order because the data sequence may be independent of the physical order. Broadcast, multicast, and communication between slaves are possible.

Transfer directly in the Ethernet frame may be used in cases where EtherCAT components are operated in the same subnet as the master controller and where the control software has direct access to the Ethernet controller. Wiring flexibility in EtherCAT may be further maximized through the choice of different cables. Flexible and inexpensive standard Ethernet patch cables transfer the signals optionally in Ethernet mode (100BASE-TX) or in E-Bus (LVDS) signal representation. Plastic optical fiber (POF) can be used in special applications for longer distances. The complete bandwidth of the Ethernet network, such as different fiber optics and copper cables, can be used in combination with switches or media converters. Fast Ethernet (100BASE-FX) or E-Bus can be selected based on distance requirements.

Further, such an embodiment using EtherCAT supports an approach for synchronization with accurate alignment of distributed clocks, as described in the IEEE 1588 standard. In contrast to fully synchronous communication, where synchronization quality suffers immediately in the event of a communication fault, distributed aligned clocks have a high degree of tolerance from possible fault-related delays within the communication system. Thus, data exchange may be completely done in hardware based on "mother" and "daughter" clocks. Each clock can simply and accurately determine the other clocks' run-time offset because the communication utilizes a logical and full-duplex Ethernet physical ring structure. The distributed clocks may be adjusted based on this value, which means that a very precise network-wide time base with a jitter of significantly less than 1 microsecond may be available.

However, high-resolution distributed clocks are not only used for synchronization, but can also provide accurate information about the local timing of the data acquisition. For example, controls frequently calculate velocities from sequentially measured positions. Particularly with very short sampling times, even a small temporal jitter in the displacement measurement may lead to large step changes in velocity. In an embodiment comprising EtherCAT, the EtherCAT expanded data types (timestamp data type, oversampling data type) may be introduced. The local time may be linked to the measured value with a resolution of up to 10 ns, which is made possible by the large bandwidth offered by Ethernet. The accuracy of a velocity calculation may then no longer depend on the jitter of the communication system.

Further, in an embodiment where a network comprises EtherCAT, a hot connect function may enable parts of the network to be linked and decoupled or reconfigured "on the fly". Many applications require a change in I/O configuration during operation. The protocol structure of the EtherCAT system may take account these changing configurations.

In further examples, safety systems 90 may be provided for preventative safety in detecting potential collisions between device actors in modeling the motion of the actors through a global timeline. Further, such modeling through a global timeline may be used to set safety parameters for safety systems 90. Modeling of locations and velocities of device actors through a global timeline may enable identification of unsafe zones and unsafe times in an area of a physical workcell. Such an identification may be used to set sensing triggers of object detectors that are part of an example safety system. For example, if an area within 5 feet of a certain device actor is determined to be at risk of collision, and a buffer zone of 10 additional feet is required to insure safety during operation, a LIDAR detector may be configured to detect unexpected objects and movement within a 15 foot area of the device actor during operation, and to automatically create a safety shutdown if an object is detected. In an alternative embodiment, the LIDAR detector may be configured to create a warning signal if an object is detected in a periphery of the danger rne, and only to create a shutdown if the detected object is moving toward a potential impact zone.

In an alternate embodiment, safety systems 90 may include modeling of actors and models of defined safe zones. Analysis of the motion of the actors in software control may allow a modeled safety check to see if any actor collides with a defined safe zone. In some examples, safe zones may be defined by entry of fixed volumes of space into a software control, by image capture of a physical workcell. Safe zones may also be defined to be variable based on a detected motion, jerk, velocity, or acceleration of an object in a safe zone. In an alternate embodiment, a safe zone may be defined by input from transponder device data. For example, a transponder location device may be attached to a robotic device actor, and a safe zone defined by a distance from the transponder. The transponder may feed location data to software control, which may update safe zones within a software control or within a master safety control. In another embodiment, fixed safe zones may be defined within software control and published prior to a safety PLC within a master safety control prior to operation of a building process.

In some examples, system devices 40 may additionally include one or more sensors 46 and 48, such as laser-based, infrared, or computer vision-based sensors. Master control 10 may stream data in from one or more different types of sensors located within the physical workcell. For instance, data from the sensors may reflect dimensions or other properties of parts and/or materials within a physical workcell, as well as how the parts and/or materials are currently positioned within the real world. This data may then be streamed out to one or more robotic device actors 42 and 44 within the environment to control robotic actions, such as to accurately define a pick-up point or to adjust the pressure applied to a particular material to avoid damaging the material.

In further examples, robotic device actor 42, 44 may be configurable to operate one or more tools for use in construction, such as spindles, grippers, drills, pincers, or welding irons. In some examples, robotic device actors 42, 44 may be able to switch between one or more tools during a building process using a tool rack and/or automated tool changer 50. For instance, master control 10 may contain programming logic in order to automate the selection and equipping of tools from tool rack 50. In other examples, instructions to cause one of the robotic device actors 42, 44 to change tools using the tool rack/tool changer 50 may come from independent manual control 28 as well or instead.

II. Example System Devices

Referring now to FIGS. 2A-2C and 3A-C, several non-limiting examples of system devices 40, including robotic device actors 42, 44 and a tool rack/tool changer 50 will be described. Although these figures focus on the use of robotic arms, other types of device actors 42, 44 or system devices 40 may be used in some examples as well or instead.

Figure 2A:
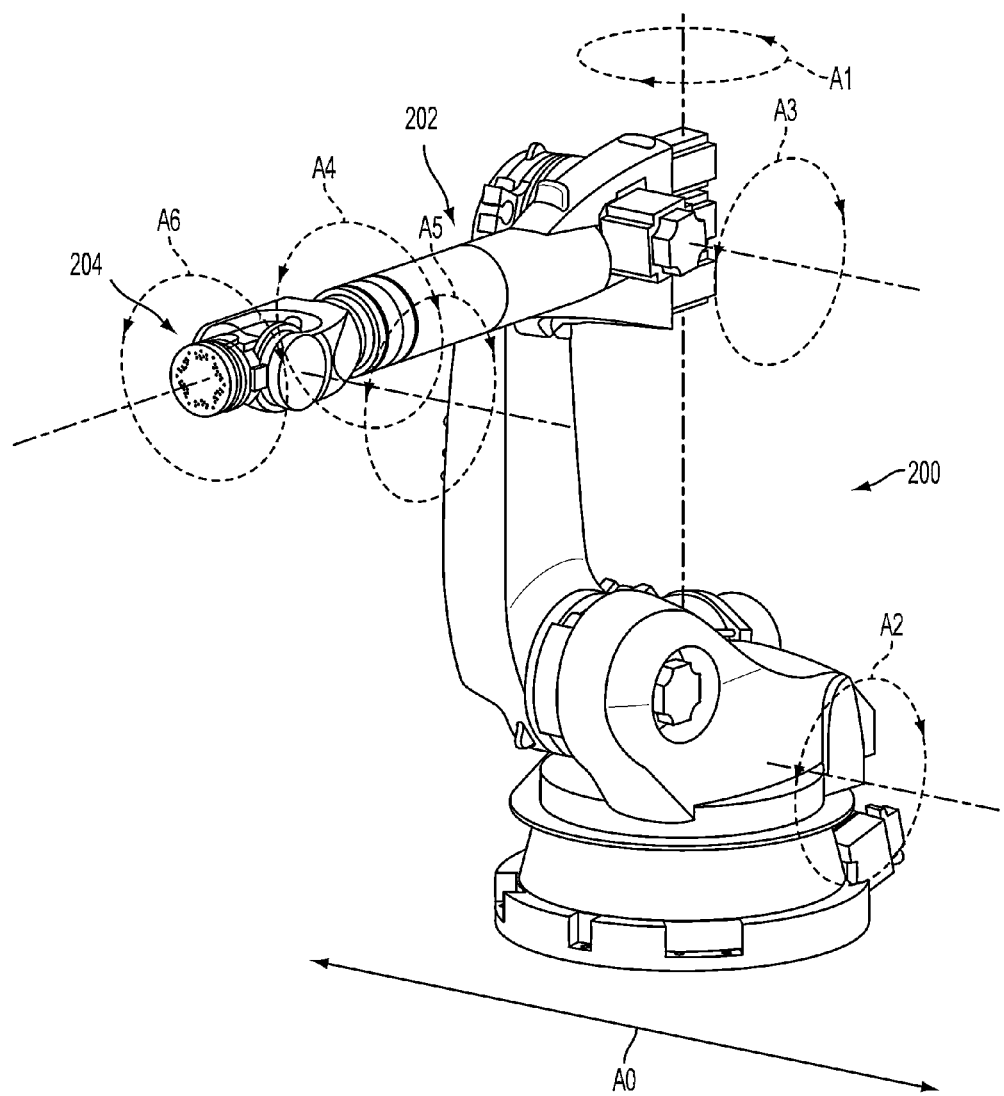
FIG. 2A shows a view of a robot with 7 degrees of freedom, according to an example embodiment.

FIG. 2A illustrates a robotic device actor, according to an example embodiment. In particular, robotic device actor 200 may include a robotic arm 202 with an end effector 204 capable of being equipped with one or more different tools. The robotic arm 202 may be capable of motion along six degrees of freedom, depicted in FIG. 2A as A1-A6. In certain examples, robotic device actor 200 may be further capable of motion along one or more axes A0, such as along a rail which is not shown that allows side to side movement. In certain embodiments, instructions may be given to position end effector 204 at a specific location, and the positions of the robotic arm 204 along A1-A6 and/or of robotic device actor 200 along one or more axes A0 may be calculated by a process of the related manufacture control system. In alternative embodiments, position control of robotic device actor 200 and/or robotic arm 202 may require separate, individual settings and control commands. Robotic devices operating with fewer degrees of freedom may be used in some examples as well or instead.

Figure 2B:
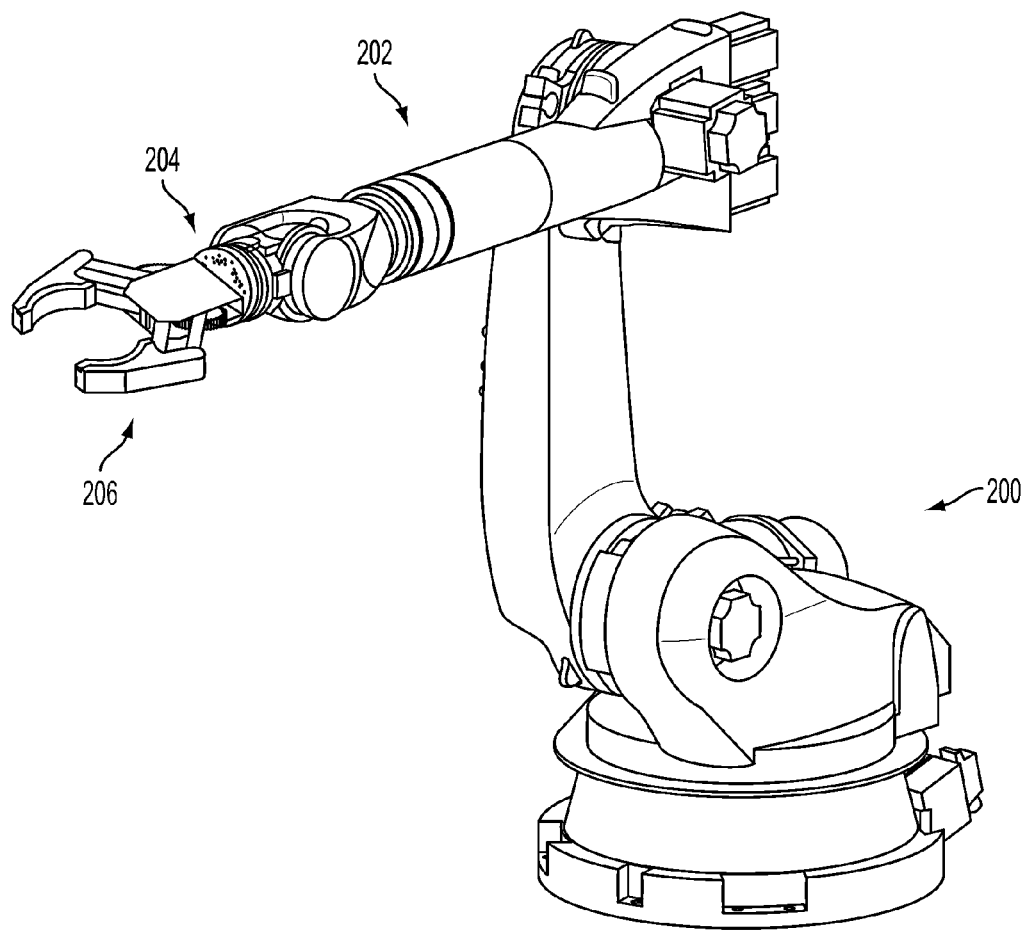
FIG. 2B shows a view of a robot with an attached gripper, according to an example embodiment.

FIG. 2B illustrates robotic device actor 200 equipped with a gripper 206. In particular, the gripper 206 may be placed at end effector 204 of the robotic arm 202. The gripper 206 may be used for various functions during a building process, such as picking up objects or parts, moving objects or parts, holding objects or parts, and/or placing objects or parts. A variety of different types of grippers may be used, such as a vacuum gripper, a tumble gripper, or a passive centering gripper. Additionally, grippers with different dimensions or other properties may be used, possibly to coincide with different types of robot actors within a physical workcell.

Figure 2C:
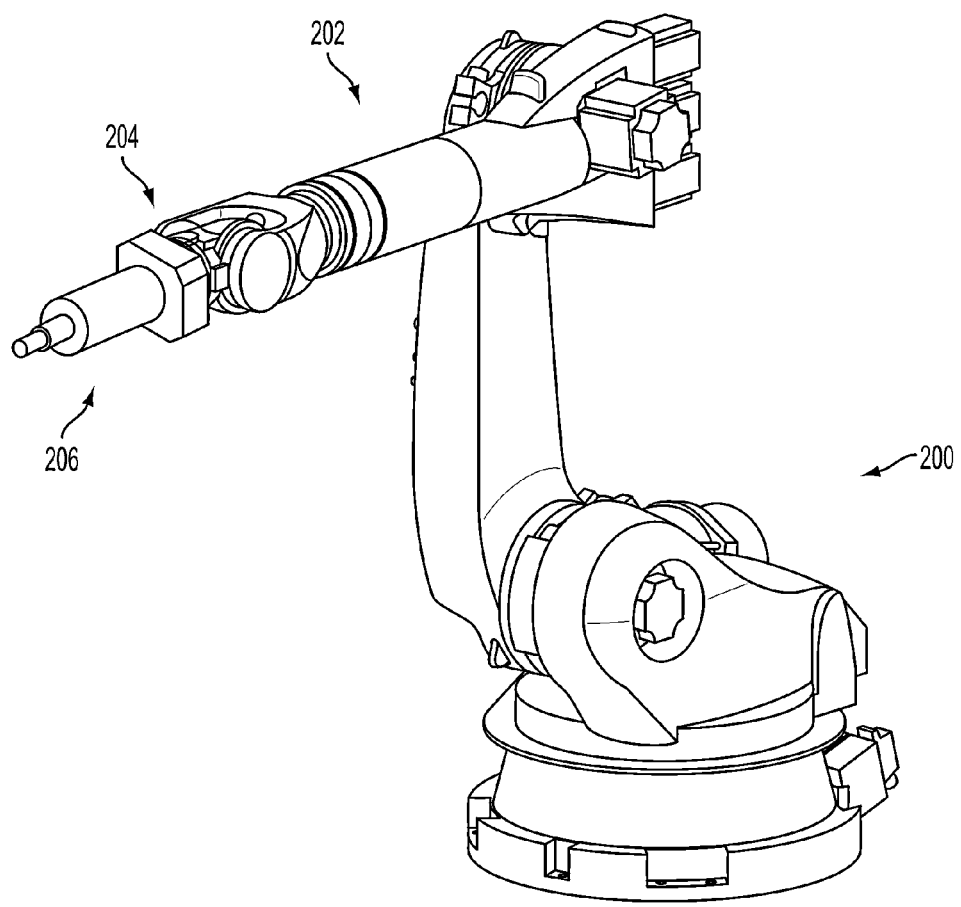
FIG. 2C shows a view of a robot with an attached spindle, according to an example embodiment.

FIG. 2C illustrates robotic device actor 200 equipped with a spindle 208. A spindle 208 may include a rotating axis for use in various functions within a building process, such as cutting materials, shaping materials, milling or routing. The spindle 208 could be a variety of different types, such as a grinding spindle, an electric spindle, a low-speed spindle, or a high-speed spindle. Additionally, spindles with different dimensions or other properties may be used, depending on the different types of robot actors within a physical workcell. In some examples, other types of tools may be used by robotic device actors as well or instead.

Figure 3A:
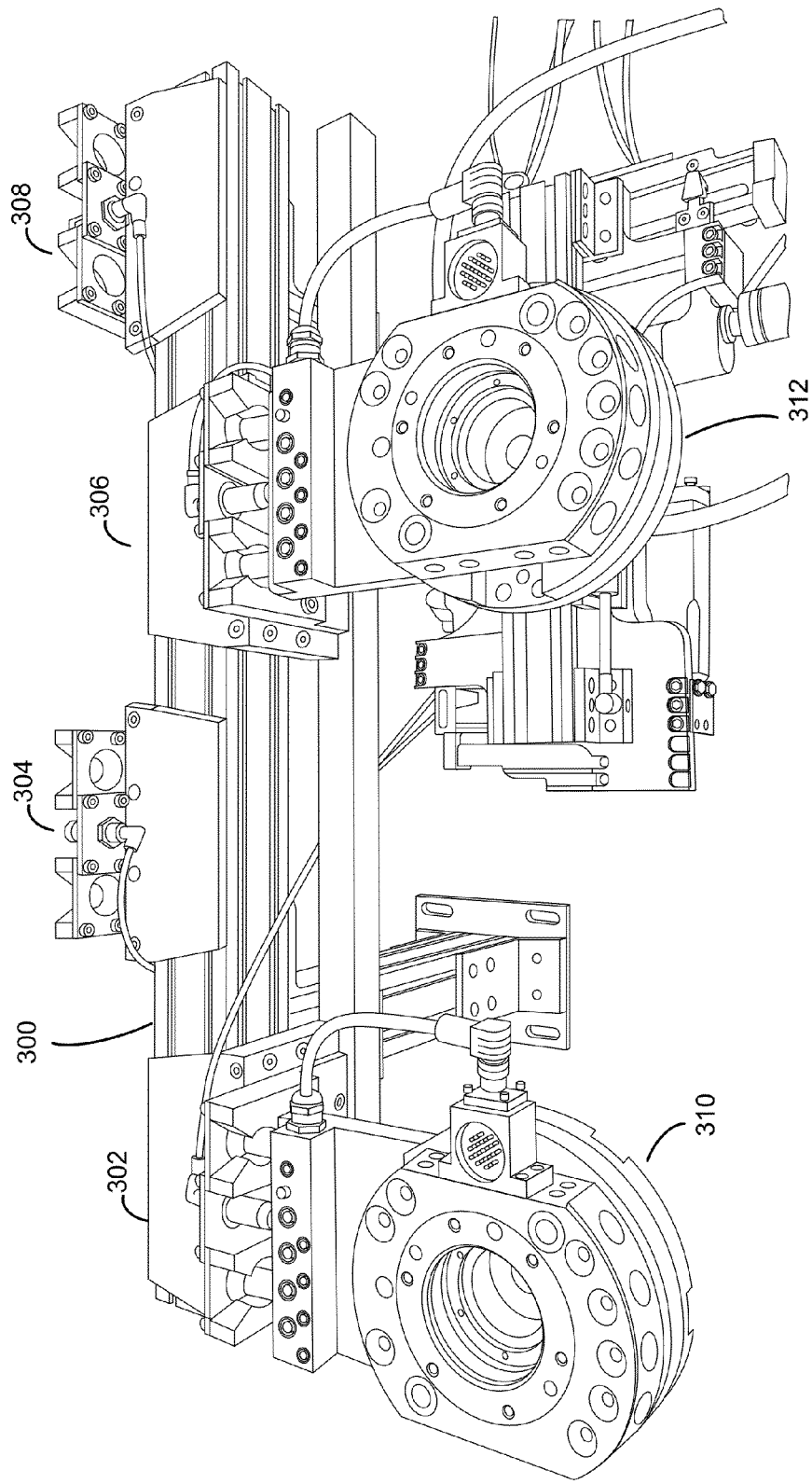
FIG. 3A shows a view of a tool rack, according to an example embodiment.

FIG. 3A illustrates a tool rack, according to an example embodiment. The tool rack may contain a number of different fabrication tools (e.g., spindles or grippers) and may be used along with an automated tool changer in order to equip robotic devices with particular tools to use within a physical workcell. In some examples, the tool rack may contain several tool rack modules 302, 304, 306, 308 positioned along a track 300, with each of the tool rack modules 302, 304, 306, 308 containing one or more particular tools. In some examples, one or more of the tool rack modules 302, 304, 306, 308 may be moveable along the track 300. In further examples, a tool rack module may be capable of interfacing with a slave module that allows for a particular tool to be selected from the tool rack module and then equipped onto a robotic device. For instance, referring to FIG. 3A, tool rack module 302 may interface with slave module 310 and tool rack module 306 may interface with slave module 312.

In order to facilitate tool changing, the tool rack modules may be equipped with built-in safety sensors to minimize the risk of accidental tool fetch and drop commands. Additionally, the tool change slave modules may include IO breakout boxes to simplify passing IO trigger signals to control tools. In some examples, the IO breakout boxes may interface with a timing control system, such as master control 10 described with respect to FIG. 1, that controls the robotic devices within a physical workcell. Master control 10 may be used to direct a tool change for a particular robotic device, which may be configured in advance using software control 26 and/or from independent manual control 28 during runtime.

Figure 3B:
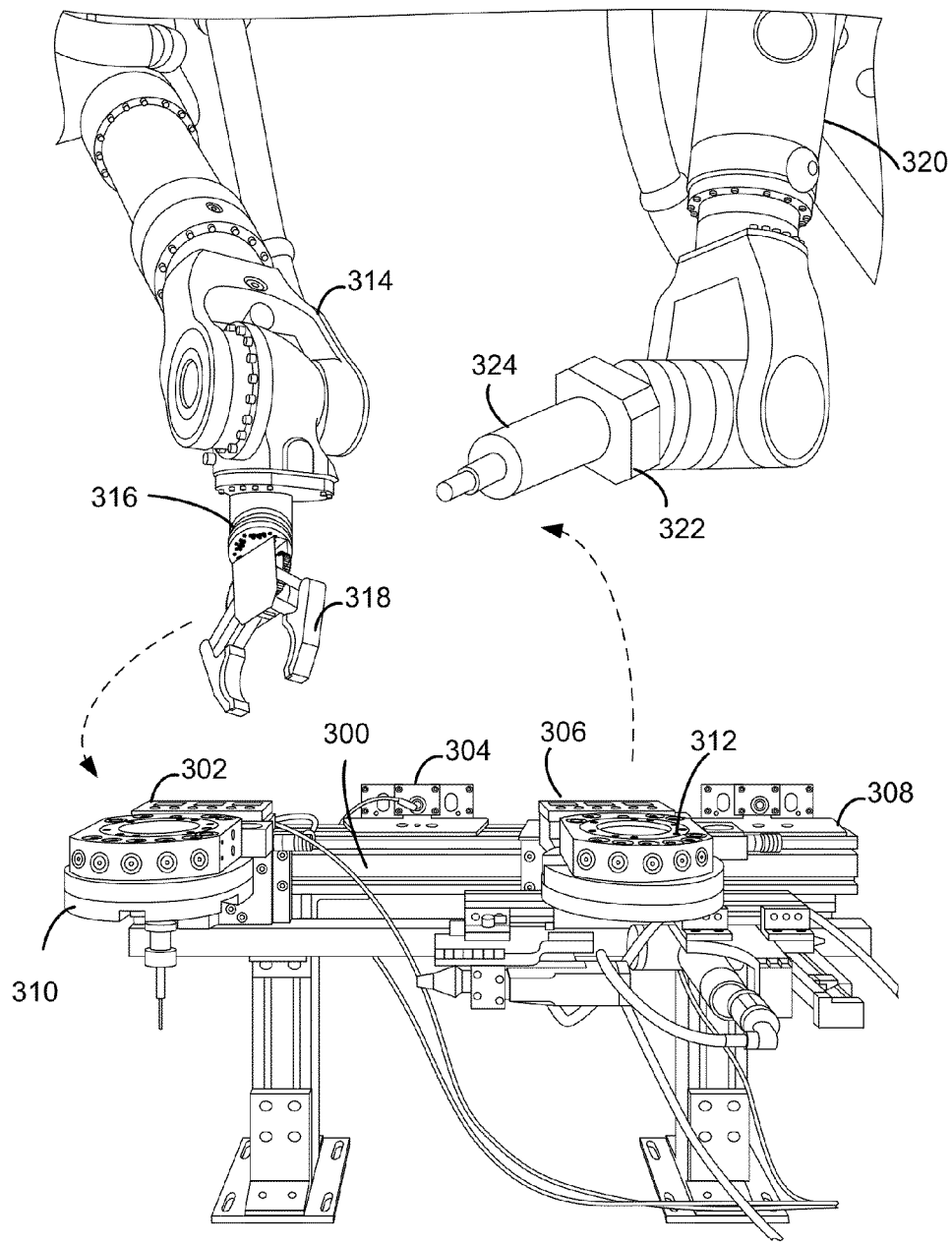
FIG. 3B shows a view of a tool rack and two robots, according to an example embodiment.

FIG. 3B illustrates use of the tool rack to equip robotic devices with tools, according to an example embodiment. In particular, a first robotic device 314 may move its end effector 316 to a position over a slave module 310 that interfaces with a tool rack module 302 of a tool rack. For instance, the robotic device 314 may currently be equipped with gripper 318, and may be controlled to move to the tool rack in order to place gripper 318 in the tool rack and equip a different tool held by tool rack module 302. Additionally, a second robotic device 320 may have positioned its end effector 322 on slave module 312 in order to equip spindle 324, which may have been held by slave module 312. After equipping spindle 324, robotic device 320 may then proceed to move away from the tool rack and complete operations using the spindle 324. The tool rack modules may be positioned on the tool rack so that multiple robotic devices may equip or change tools at the same time. In some examples, additional rack modules 304, 308 may contain additional tools that may be equipped by one or more robotic devices.

In further examples, instructions from a control system, such as master control 10 described with respect to FIG. 1, may be used in order to instruct a robotic device how to equip a tool during runtime (e.g., to determine where a tool is within the tool rack and solve an end effector problem in real time in order to position the end effector over a slave module to enable the robotic device to pick up the tool). In additional examples, a drive system (e.g., a VFD used to supply power drive a spindle) may be mounted at a separate fixed location within a physical workcell in order to supply power on the tool changer system.

IV. Example Graphical Interfaces

Figure 4A:
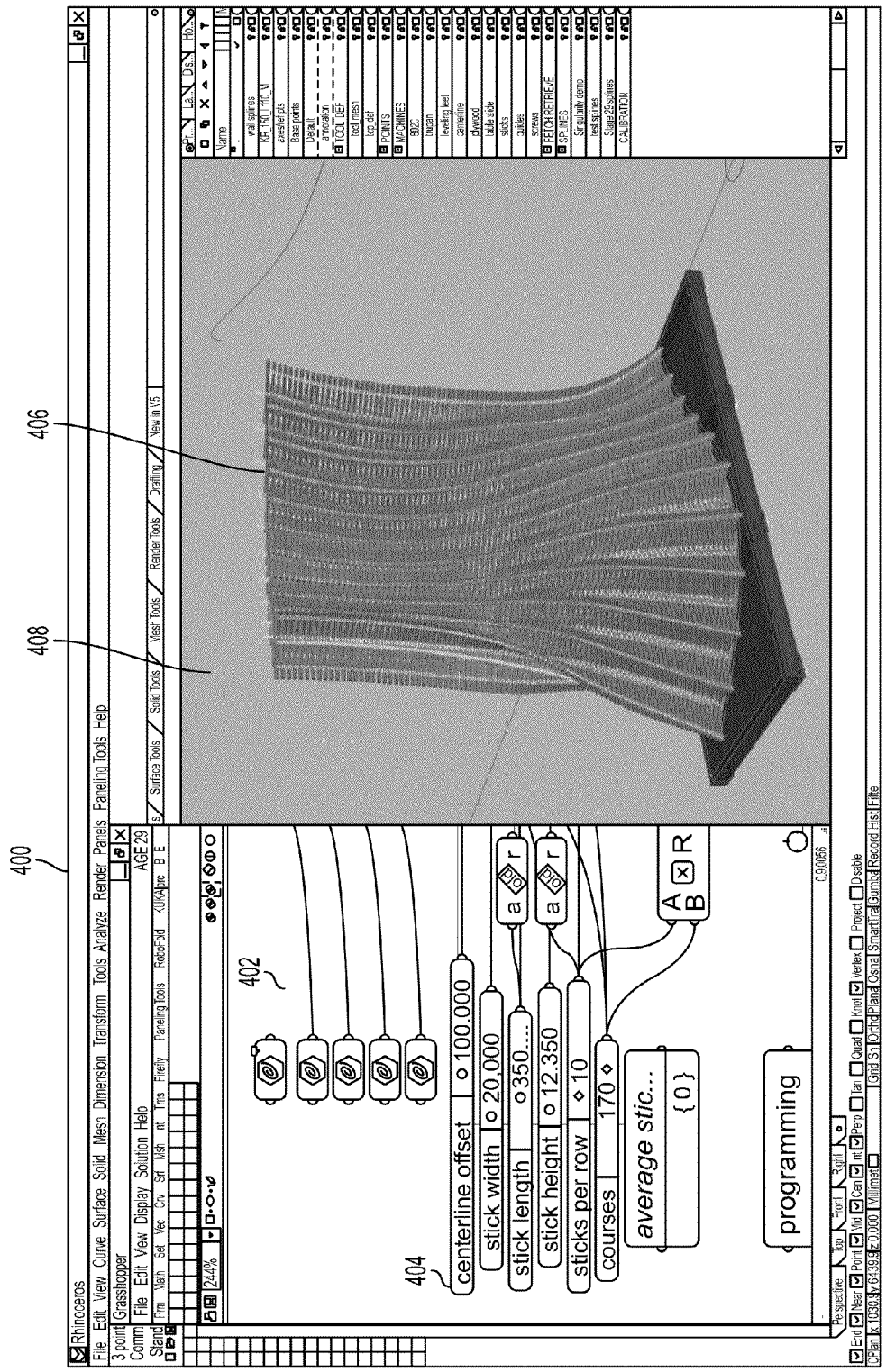
FIG. 4A shows a graphical interface with a 3D model, according to an example embodiment.

FIG. 4A shows a graphical interface containing a 3D model, according to an example embodiment. As shown, a graphical interface 400 may contain an input window 402 which may allow a user to enter parameters relating to an output product 406, such as a wall built using individual sticks. The input window 402 may allow the user to enter parameters 404 that may relate to aspects of the output product, including dimensions, density, curvature properties, other geometric properties, materials to be used, and/or other numeric inputs. The inputs may be used to derive a parametric solution for an output product 406. Additionally, the inputs may be used to generate a sketch of the output product 406 within a display window 408 of the graphical interface 400.

Figure 4B:
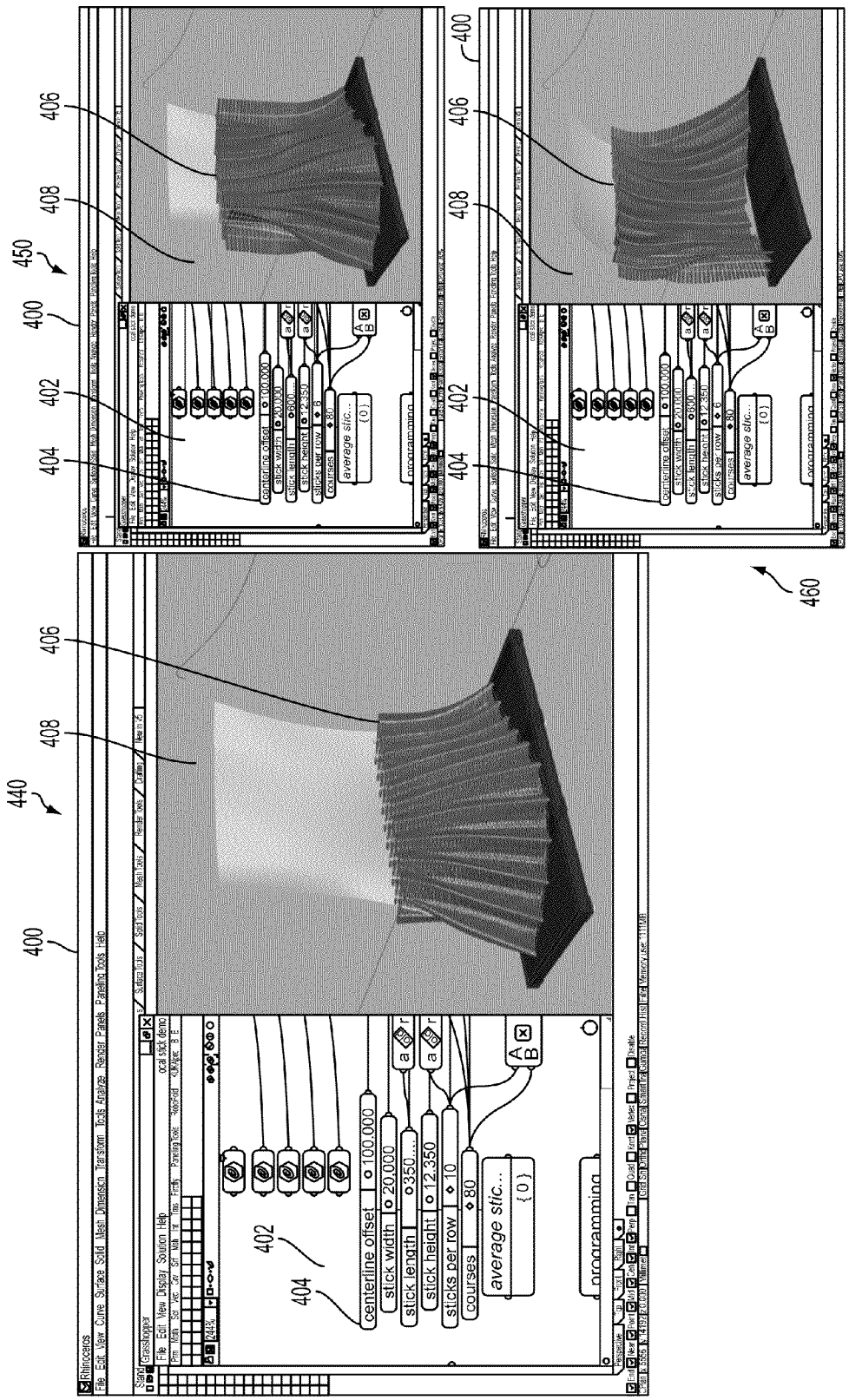
FIG. 4B shows additional graphical interfaces with 3D models, according to an example embodiment.

FIG. 4B shows three different output products based on different user input parameters, according to an example embodiment. A first view of the graphical interface 440 may contain an input window 402 and a display window 408. The input window 402 may allow a user to enter parameters 404 relating to a desired output product, including product dimensions, density, curve offsets, amount or type of curvatures, and/or other geometric or numerical inputs. Based on the input parameters 404, a geometric representation of the output product 406 may be displayed within the display window 408. In some examples, a user may modify individual parameters 404 in order to change aspects of the output product 406.

For instance, a second view of the graphical interface 450 shows a different output product 406 within the display window 408 based on different input parameters 404 within the input window 402. In this example, dimensions of the output product 406 and/or materials used to produce the output product 406 may be modified to produce an output product 406 with a greater height as shown in the second view 450. Further, a third view 460 shows another different output product 406 within the display window 408 based on different input parameters 404 within the input window 402. For example, parameters relating to the curvature of the output product may be modified by a user in order to produce another different output product 406 as shown in the third view 460.

Figure 5:
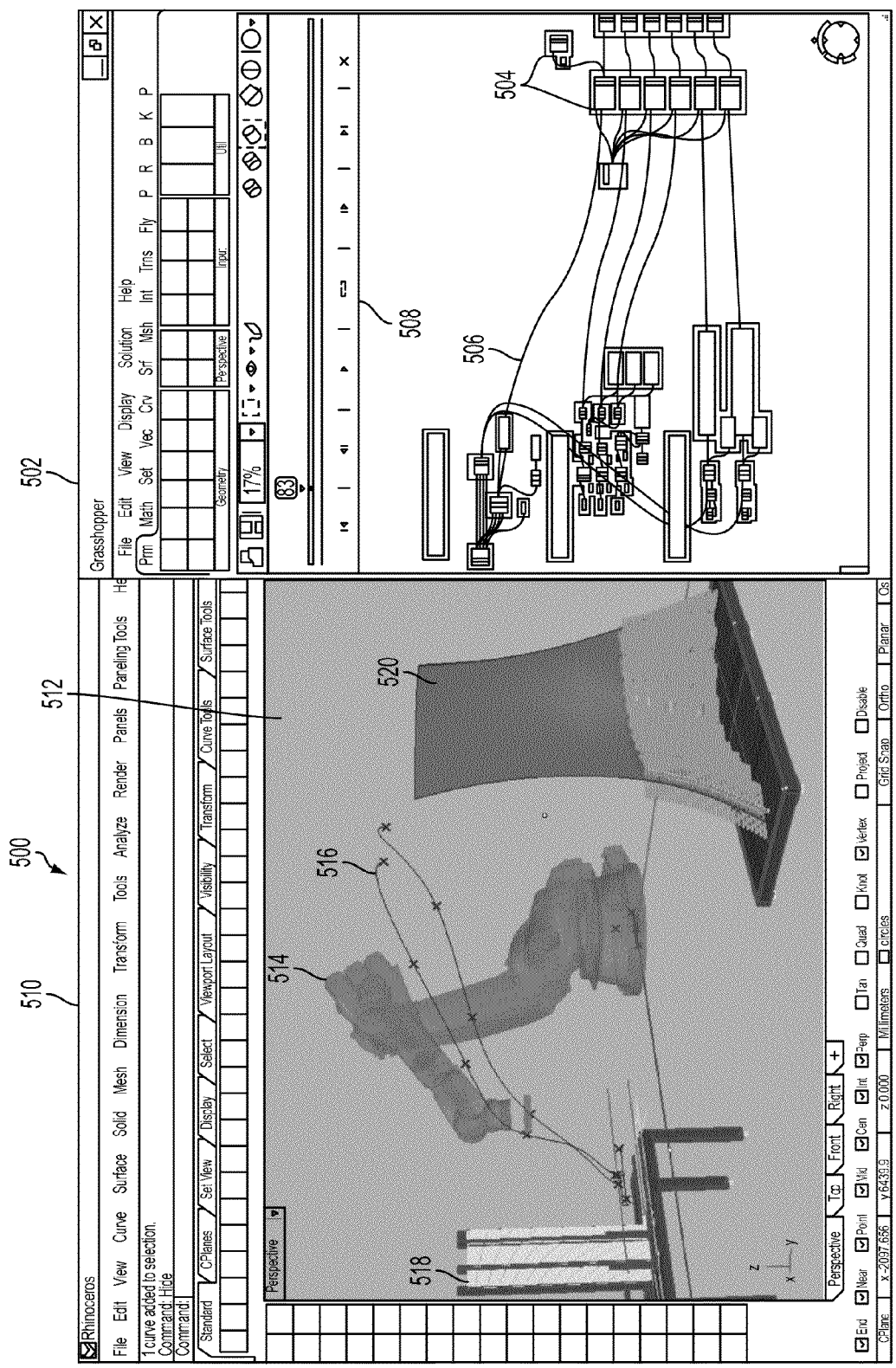
FIG. 5 illustrates a node-based graphical interface and a visualization of a building process, according to an example embodiment.

FIG. 5 shows a graphical interface for architecting a robotic building process, according to an example embodiment. For example, the graphical interface may be part of software control 26 as described above with respect to FIG. 1. As shown, a graphical interface 500 may contain an input window 502 which allows a user to control aspects of the building process, including nodes related to robot actors, tools, motion paths, and tool operations for use during construction. The graphical interface 500 may additionally contain a display window 510 which contains a 3D geometric view of the physical workcell, including components such as robot actors, tools, materials, and/or constructed output products. In example embodiments, the input window 502 may provide a visual programming interface or different type of interface that may allow a user to enter parameters describing a desired output product and/or information about the actors and tools to be used in the building process. Input data collected using the input window 502 may be used to control geometry and/or other aspects of the physical workcell displayed within the display window 510.

In one example, a user may input parameters to control a building process using an input window 502 containing a visual programming interface, such as an interface bulk using a visual programming language, such as a commercial software program known as Grasshopper. The interface may allow a user to include one or more nodes 504 which may represent components of the building process, such as robot nodes representing different types and/or configurations of robots, tool nodes representing different types and/or configurations of tools, IO nodes representing types of available IO, track nodes representing possible tracks of motion of robot actors, and command nodes for determining motion commands and other types of commands for robot actors.

As shown within window 502 of FIG. 5, individuals nodes 504 may be connected together using connectors 506. A connector 506 between two nodes may indicate that the output of a first node is to be used as an input to a second node. For instance, a single robot node may receive as inputs information from several different component nodes, such as nodes representing the type of robot, the type of tool used by the robot, a track the robot can travel along, and so on.

In further examples, the window 502 of FIG. 5 may contain a timeline 508. The timeline 508 may have a cursor representing a current timestamp (e.g., 83 as shown in the figure) which may represent a particular point in time of the manufacturing process. In addition, the timeline 508 may contain buttons to play through the building process at a particular speed, or fast-forward or rewind through the building process. The timeline 508 may be used to control the point in time at which the geometry and/or other aspects of the physical workcell are displayed within the display window 510. Further, the timeline 508 may be used to indicate a particular point in time either for purposes of simulating the building process or for visualizing within software an actual physical building process taking place within the physical world.

As shown in FIG. 5, the user interface may additionally contain a display window 510 which may display geometry and/or other aspects of the physical workcell based on inputs from the input window 502. For example, the display window 510 may include geometry relating to robot actors, tools, building materials, robotic motion paths, and output products, among other things. In one example, the display window 510 may be designed using a commercial 3D modeling software, such as Rhinoceros, as shown within FIG. 5. The display window 510 may display geometry within a particular physical workcell 512. The display window 510 may include options to change the perspective of the physical workcell 512 and/or to zoom in or zoom out a view of the physical workcell 512.

The physical workcell 512 may include one or more robot actors 514. The robot actors 514 may be device actors 42 and/or 44 as described above with respect to FIG. 1 and/or robotic device 200 as described with respect to FIGS. 2A-2C. Support may be provided for numerous different types of multi-axis robotic systems of different types and/or from different manufacturers. In some examples, one or more of the robot actors 514 may be traditional six-axis robots. In additional examples, other types of robots that may be configured to operate along fewer or more axes may be included for use within the physical workcell 512 in addition or instead.

In further examples, robot actors may be represented within a software interface as robot nodes, which may be put together from a number of interchangeable component nodes, including robot nodes representing different makes and models of commercial robots, tool nodes representing different types of physical tools that may be used for construction such as grippers or spindles, IO nodes representing different types IO available to communicate with a robot actor and track nodes representing different types of axes that a robot can move along. In some examples, individual tools and/or tooling parameters (such as wrist mount offsets or tool center points) can be abstracted into components that can be assembled by a user into compound tools as well.

The display window 510 may additionally contain one or more motion paths 516 representing paths of motion of individual robot actors 514. The motion paths 516 may indicate paths to be taken by the robot actors 514 during the building process, such as to pick up materials and attach them to an object under construction. In some examples, the motion paths 516 may further indicate points at which particular input or output actions will occur. For instance, an "x" on a motion path 516 may indicate a point at which a robot actor 514 uses a tool such as a gripper to pick up a particular type of material. In further examples, the motion paths 516 may be synchronized with the timeline 508 from the input window 502. Accordingly, in some examples, the robot actors 514 may be made to move along the motion paths 516 to positions at particular points in time based on the timestamp indicated by the timeline 508.

The physical workcell 512 may additionally contain one or more materials 518 to be used during the building process. In this simplified example, the materials 518 consist of sticks used to construct a wall 520. Motion paths 516 may be determined for the robot actor 514 to take in order to move the individual sticks 518 onto the wall 520. In other examples, a variety of different types of materials, including connective materials such as glue, may be used simultaneously by the robot actors to construct more complex output products.

In further examples, the physical workcell 512 may also contain other components not shown in FIG. 5 that may be used in the building process. For instance, one or more sensors may be included to sense information about the robot actors and/or materials in the physical workcell in order to influence motion paths taken by the robot actors. For example, a torque sensor may be used to determine if a particular piece of material is likely to break under stress. A control system, such as master control 10 described above with respect to FIG. 1, may be used to interface with the robot actors and/or sensors within the physical workcell.

In some examples, the display window 510 may provide users with multiple 3D views of the physical workcell and may allow a user to change the orientation and/or zoom of a particular view. In other examples, the display window 510 may present other types of representations of the physical workcell, such as numerical representations, as well or instead.

V. Example System Workflow

Figure 6A:
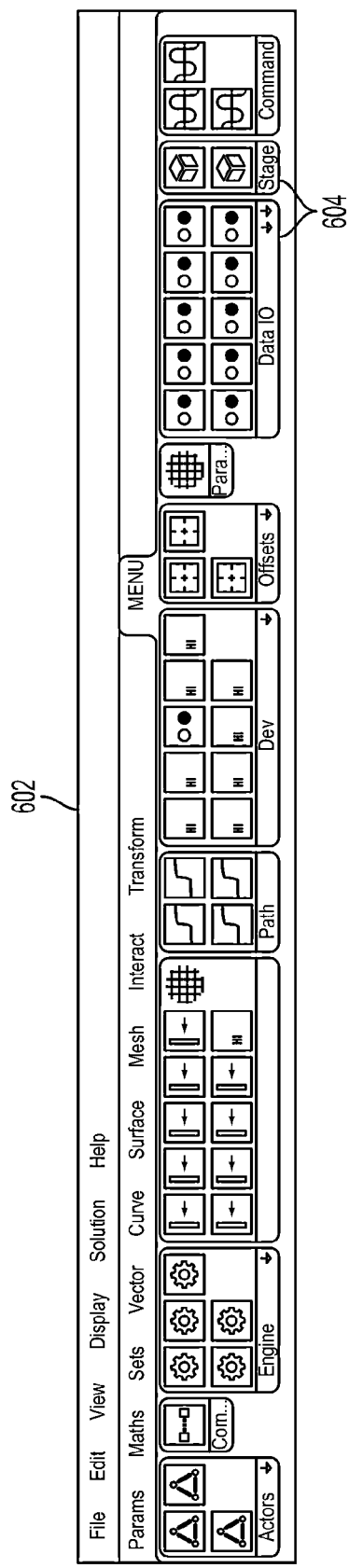
FIG. 6A illustrates a toolbar for a graphical interface, according to an example embodiment.

In some examples, an input window may additionally contain a toolbar containing digital tools to control aspects of the building process. FIG. 6A shows a toolbar for a graphical interface, according to an example embodiment. The toolbar 602 may be equipped with a variety of different toolsets 604 that may be used to design or control a building process within an input window of a graphical interface. Toolsets 604 may be provided with digital tools relating to generating robot motion paths, transforming between different planes or axes, describing robot actors, describing physical building tools, sequencing individual robot motions, communicating data input and/or output to and/or from robot actors, mapping between a virtual software environment and a physical workcell, and/or enabling visualization of a building process, for example.

Figure 6B:
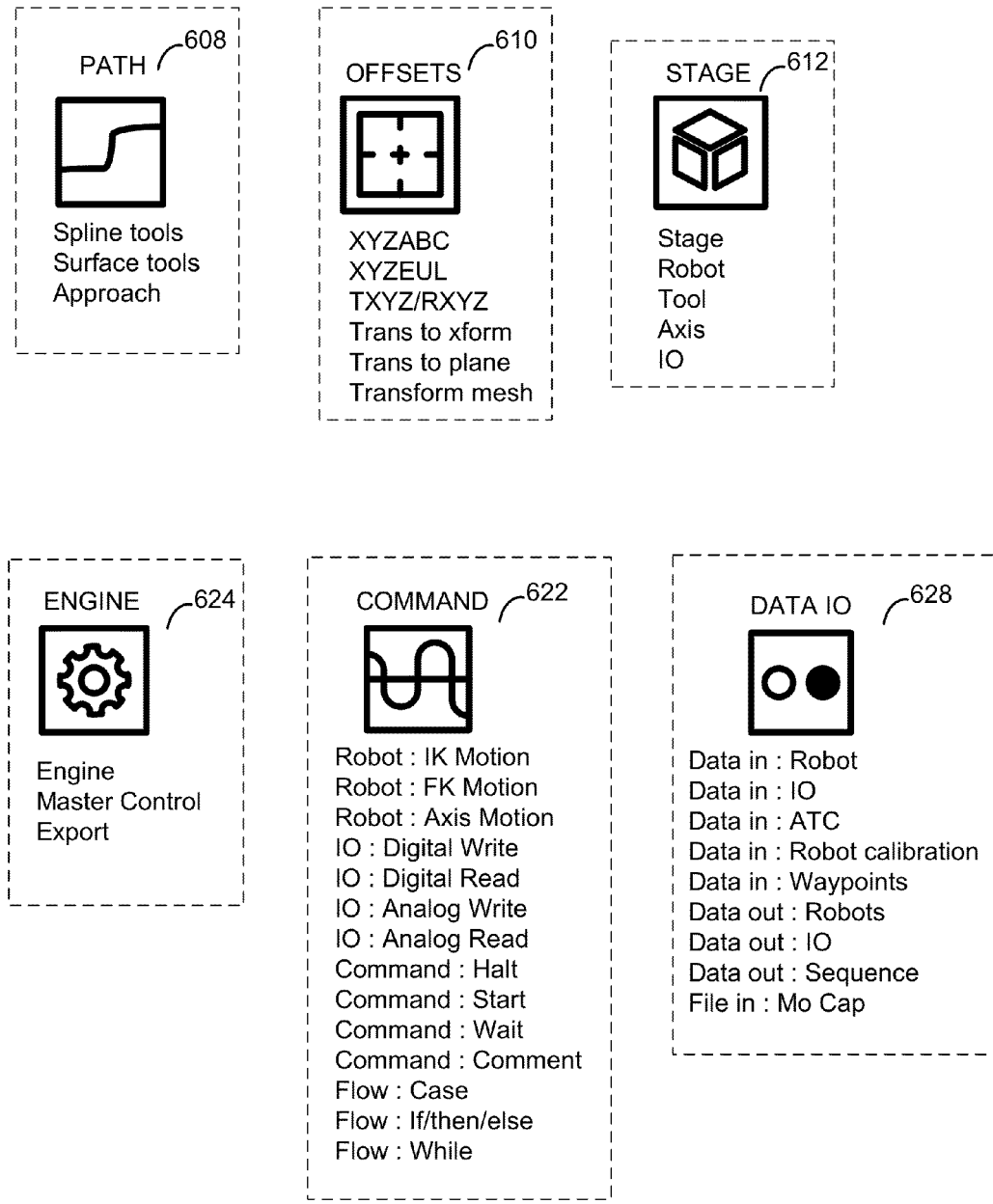
FIG. 6B illustrates an organization of digital tools, according to an example embodiment.
Figure 6C:
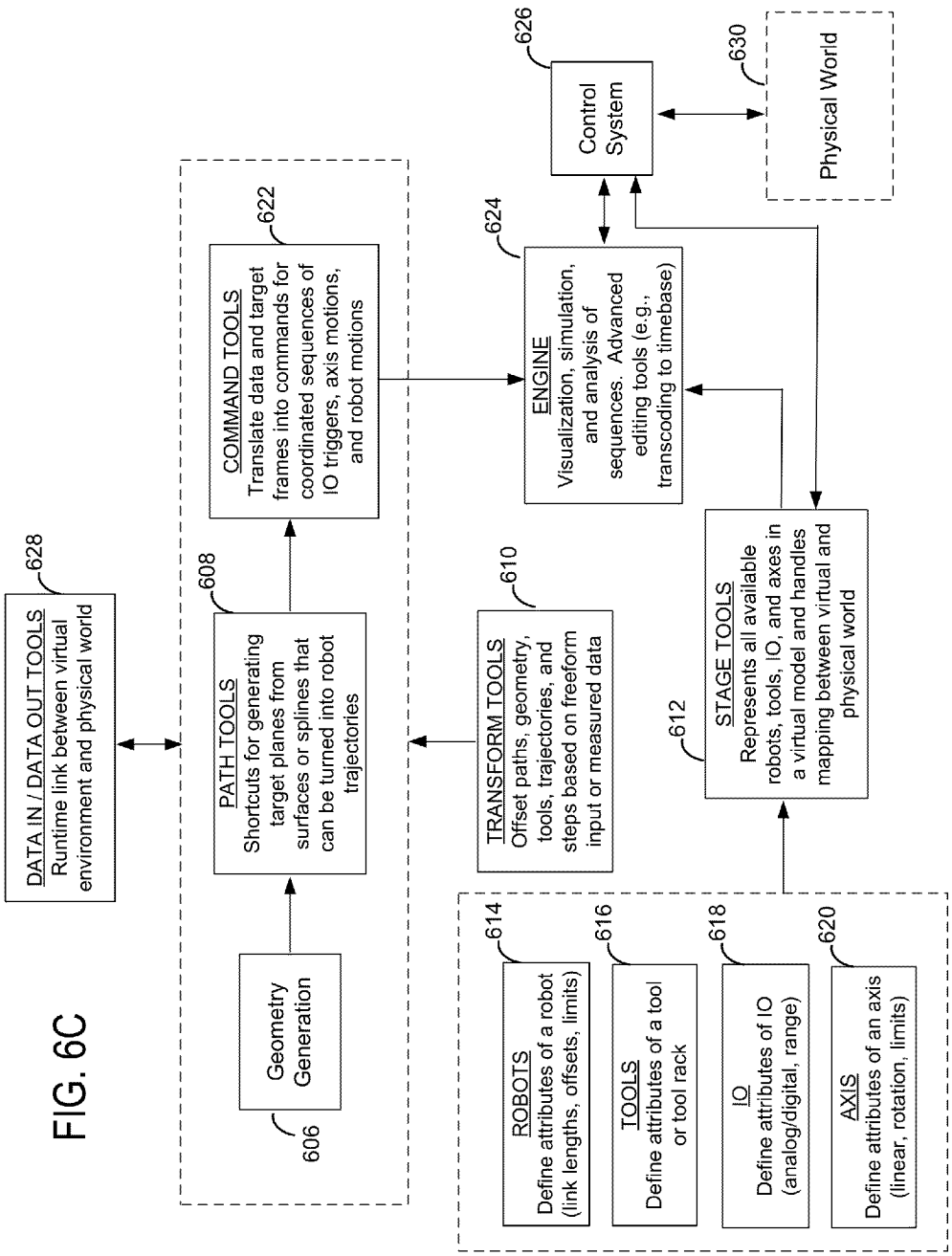
FIG. 6C is a block diagram of an example workflow, according to an example embodiment.

FIG. 6B shows an organization of digital tools within a toolbar, according to an example embodiment. As shown, the digital tools may be divided into a number of different categories. The digital tools may then be used in combination to design a building process, as shown by FIG. 6C. FIG. 6C is a block diagram of an example workflow, according to an example embodiment. In particular, FIG. 6C shows workflow involving a number of digital tools, which may be accessible within a toolbar as depicted in FIG. 6A and FIG. 6B or by another means within a graphical interface. As shown, the digital tools may be divided into a number of different categories. One or more digital tools from a number of different categories may be selected by a user to affect particular aspects of the building process, including the robot actors and other components within a physical workcell that may be used in the process.

In one example, a toolbar may include path tools 608 relating to generating target planes that may be used to determine motion paths of robot actors. In some examples, the path tools 608 may take as input geometry 606 describing a desired output product, such as geometry generated by parametric modeling software, Grasshopper. For instance, the output product geometry 606 may be generated based on user input within an input window specifying aspects of the output geometry, including dimensions, density, curvature, materials, and so on. The path tools 608 may then determine target planes for robot motion paths based on the output product geometry 606.

In some examples, the output product geometry 606 may include particular splines, surfaces, and/or other geometrical constructions to be included within an output product. The path tools 608 may then provide shortcuts for generating target planes relating to aspects of the output product in a format that can be turned into particular robot trajectories that may be used to construct an output product containing the target planes. Motion paths for individual robot actors may then be derived as a function of the target planes in addition to tool definitions and material properties, for example.

In further examples, a toolbar may include transform tools 610 relating to transformations between different axis frames or offsets, as shown by FIG. 6B and FIG. 6C. For instance, the transform tools 610 may provide transformations between coordinate frames at the base or joints of a particular robot and a stage containing the output product. In other examples, the transform tools 610 may additionally allow for transformations between multiple robots operating within different frames of reference as well. As shown in FIG. 6C, transformations may be applied before and/or after determining sequences of motion for individual robot actors.

In further examples, a toolbar may include stage tools 612 that represent aspects of a physical workcell, such as robot actors, tools, IO, and/or axes. In some examples, stage tools 612 may also provide a mapping between virtual robots in software and physical robot actors within the physical workcell, as shown by FIG. 6B and FIG. 6C. The stage tools 612 may be used by engine node 624 to send trajectories for robot actors to take based on output from command tools 622 to a control system 628. In some examples, stage node 612 may be configured in order to specify the currently available robotic devices and/or tools within a particular physical workcell. The control system 626 may then command robot actors and/or other components within the physical world 630 based on information from stage tools 612.

In some examples, stage tools 612 may take input from one or more robot nodes 614 representing attributes of individual robot actors within a physical workcell, as shown by FIG. 6B and FIG. 6C. A robot node 614 may be used to define attributes of a robot actor, such as traditional six-axis robots or other types of robots. The robot attributes may include link lengths of the robot and/or arm lengths of the robot, offsets of the robot and/or joints of the robot, and/or limits on robot joint movement or maximum torque that a robot joint can handle, for example.

In additional examples, stage tools 612 may also take input from one or more tool nodes 616 for defining the attributes of physical building tools and/or a tool rack for holding the tools, as shown by FIG. 6B and FIG. 6C. For example, attributes of building tools such as grippers or spindles may be specified by tool nodes, which may be used to configure an automatic tool changer so that robot actors can easily switch between tools. In some examples, robot actors may switch between tools using a tool rack which stores the tools and facilitates a tool changing process, as described above with respect to FIGS. 3A and 3B.

In further examples, the tool nodes 616 may include support for compound tooling that may allow component tools to be assembled into compound tools. In particular, individual tooling parameters (e.g., wrist mount offsets or tool center points) may be abstracted into components that may be assembled into compound tools. For instance, multiple tools may be aggregated into one compound tool that has multiple tool orientations and/or center points that may be used depending on which component of the tool may be required at a particular time. For example, a compound tool with an automatic tool changer may be represented by a master interface plus a number of different attachments, such as a spindle, a vacuum array, or a gripper. In another example, a compound tool may include a series of different tools, such as a gripper plus a tensioner plus a roller. Other examples of combining multiple tools and/or combining tools by abstracting tooling into parameters that define tool orientation and/or center points are also possible.

In further examples, stage tools 612 may also take input from one or more IO nodes 618. The IO nodes 618 may describe information relating to digital and/or analog input and/or output actions that may be taken by a robot actor, such as the type of action (e.g., gripping a material) and attributes associated with the action (e.g., width of material that can be gripped). In additional examples, the robot attributes may include one or more axis nodes 620. The axis nodes 620 may describe one or more linear and/or rotational axes along which a robot can travel, including limitations on the robot's movements along the axes.

In additional examples, a toolbar may include command tools 622, as shown by FIGS. 6B and 6C. The command tools 622 may be used to determine robot commands to cause one or more of the robot actors to execute particular operations, which may include point-to-point motions, motions along external axes, and/or input or output events. For example, one of command tools 622 may be used to direct a particular robot motion along one of six degrees of freedom, a particular robot motion along an external axis, or a particular input or output event, such as applying glue to a material in a particular manner. Additionally, command tools 622 may be included for creating step nodes that instruct robot actors to take a particular sequence motion steps and carry out one or more tool actions. In further examples, coordinated sequences of motions may be generated for multiple robot actors working together within a single timeframe.

In some examples, step nodes, or sequences of motions and actions, can be abstracted into reusable subroutines. For instance, a subroutine can be defined by connecting visual building blocks, which may represent particular motion commands or motion parameters. The subroutine could then be used to make one or more robots carry out the same action sequence multiple times within a single building process. In some examples, steps can be synchronized across multiple robots so that multiple robots can work in a shared environment simultaneously. Example systems may also include an engine node 624, which may assign each of the steps to particular robotic devices within a stage.

In further examples, users may be provided with functionality to switch between steps within the graphical interface. For instance, timeline 508 as illustrated and described with respect to FIG. 5 may also includes buttons to skip between steps on the timeline. In some examples, digital bookmarks may be inserted by a user for particular steps. For instance, through the graphical interface, it may be possible to jump from the beginning of a "fetch stick" step to the beginning of a "nail stick" step. These bookmarks steps within the timeline may match the steps authored by the user by inputting motion commands, IO commands, and/or other commands in a step node.

Additionally, the engine node 624 may communicate with control system 626. The control system 626 may be a computing device capable of communicating wirelessly with robot actors and/or other components such as sensors within the physical workcell in the physical world 630. In particular, the control system 626 may provide access to real time data streams from all robot actors and devices, which may allow for precise control over the physical workcell at particular points in time. The control system could communicate with some or all of the actors or devices through wired connections or other types of communication channels as well or instead, including previously described network protocols.

In some examples, the control system may additionally contain a physical control interface such as a touchscreen interface that may allow a user to interact with the control system to view live data or modify robot actions in real time. For instance, a stage file containing information about the physical workcell including actors, tools, materials, and environmental setup on the control system 626 may be accessible via a programming interface. A user who is watching a building process within the physical world 630 may then make modifications to the process before it is completed.

In additional examples, a toolbar may include data input/output tools 628 that may allow the control system 626 to send and/or receive data to and/or from the virtual software environment that determines robot motion paths, as shown by FIG. 6B and FIG. 6C. Accordingly, telemetry from the control system 626 may be used to create a live link between the virtual world in software and the physical world 630. For instance, the data input/output tools 628 may be used to process information from the control system 626 relating to the robot actors within the physical workcell and/or other components in the workcell such as sensors. Based on this information about the physical world 630, the virtual robots within software may be updated with real-time feedback from the physical world 630 (e.g., motion paths for robot actors may be determined or modified based on real-time sensor data).

Additionally, the data input/output tools 628 may be used to send data back to the control system 626 so that the control system 626 can effectuate particular input or output actions within the physical world 630, for example. For instance, the control system 626 may instruct a robot actor how use a tool in the physical world 630 (e.g., how to control a spindle) based on information from one or more digital tools within the software interface.

In further examples, engine node 624 include visualizer or simulation tools that may allow a user to simulate a building process through a user interface in software, as shown by FIG. 6B and FIG. 6C. In some examples, the visualizer tools may display the building process as geometry drawn on a screen that shows the physical workcell. In other examples, the visualizer tools may display the building process as curves representing particular data values as well or instead. Additionally, in further examples, the visualizer tools may also be used to visualize a building process in software as it is actually occurring within the physical world 630. In some examples, the visualizer tools may additionally provide a graphical representation of potential conflicts within a particular building process, such as when a robot's motion path extends outside its possible range of motion or when two robot actors may be going to collide based on the currently defined trajectories and/or step sequences.

In further examples, the visualizer component may allow a user to see simulations of the building process in advance and/or as the building takes place. In some examples, the user may use the visualizer component offline to see robotic motion paths as well as input/output events over a series of sequential steps as geometry drawn within a viewing window. In other examples, the user may be able to visualize a simulated playback as numerical data streams relating to the robot actors, materials, and/or other aspects of the physical workcell represented through curves in addition to or instead of visual geometry. In further examples, the user may also be able to see particular data points at individual timesteps, such as robotic joint values, axis values, or input/output values.

In some example systems, a user may also be able to use the visualizer component to visualize a building process that is occurring in the physical world in real time. The system may interface with a control system that receives real-time data streams from sensors that may be used to scan the physical workcell, individual robot actors, and/or parts used in construction as an output product is being built. Accordingly, the visualizer's user interfaces may be updated in real time to reflect real world dimensions, properties, and/or positions of objects and actors within the environment.

VI. Example Methods

A method 700 is provided for using generic robot code to cause robot actors to execute a process such as a manufacturing process within a workcell, according to an example embodiment. In some examples, method 700 may be carried out by a control system, such as manufacture control system 100 and/or master control 10 as described in reference to FIG. 1. The control system may communicate with the robot actors using any of the network protocols or communication methods previously described. In further examples, part or all of method 700 may be carried out by one or more robotic devices, such as device actors 42, 44 within system devices 40 as described in reference to FIG. 1, or device actor 200 as illustrated and described in reference to FIGS. 2A-2C. Additionally, while examples with certain numbers and types of system devices may be described, various alternative embodiments may include any number and type of robotic devices as well.

Furthermore, it is noted that the functionality described in connection with the flowcharts described herein can be implemented as special-function and/or configured general-function hardware modules, portions of program code executed by a processor for achieving specific logical functions, determinations, and/or steps described in connection with the flowchart shown in FIG. 7. Where used, program code can be stored on any type of computer-readable medium, for example, such as a storage device including a disk or hard drive.

Figure 7:
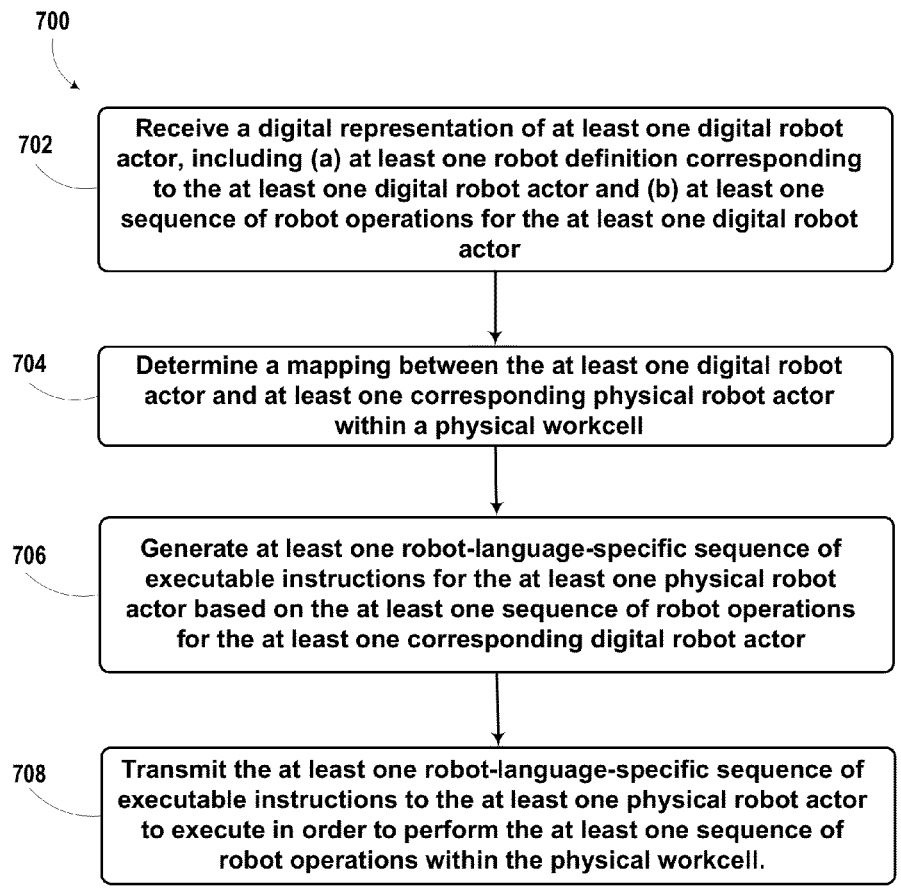
FIG. 7 is a block diagram of an example method, according to an example embodiment.

In addition, each block of the flowchart shown in FIG. 7 may represent circuitry that is wired to perform the specific logical functions in the process. Unless specifically indicated, functions in the flowchart shown in FIG. 7 may be executed out of order from that shown or discussed, including substantially concurrent execution of separately described functions, or even in reverse order in some examples, depending on the functionality involved, so long as the overall functionality of the described method is maintained.

As shown by block 702 of FIG. 7, method 700 may include receiving a digital representation of at least one digital robot actor. In particular, the digital representation may be received as a file containing instructions using a generic robot trajectory format. The representation may be received in a number of different electronic formats using one of a number of different possible modes of communication. Within examples, the digital representation may contain a description of one or more digital robots and robotic operations to execute in order to complete a process, such as a process for manufacturing or construction.

In further examples, the digital representation may first be generated based on a user's interactions with a software system, such as software control 26 described with respect to FIG. 1. Additionally, the digital representation may be generated using any or all of the graphical interfaces or systems described and illustrated with respect to FIGS. 4A-4B, 5, and 6A-6C. In particular, a software system may allow a user to design a robotic process, such as a manufacturing process, including robot motions and tool actions. The software system may then export the instructions to a control system, such as master control 10 described with respect to FIG. 1, using an example generic robot code format.

Figure 8A:
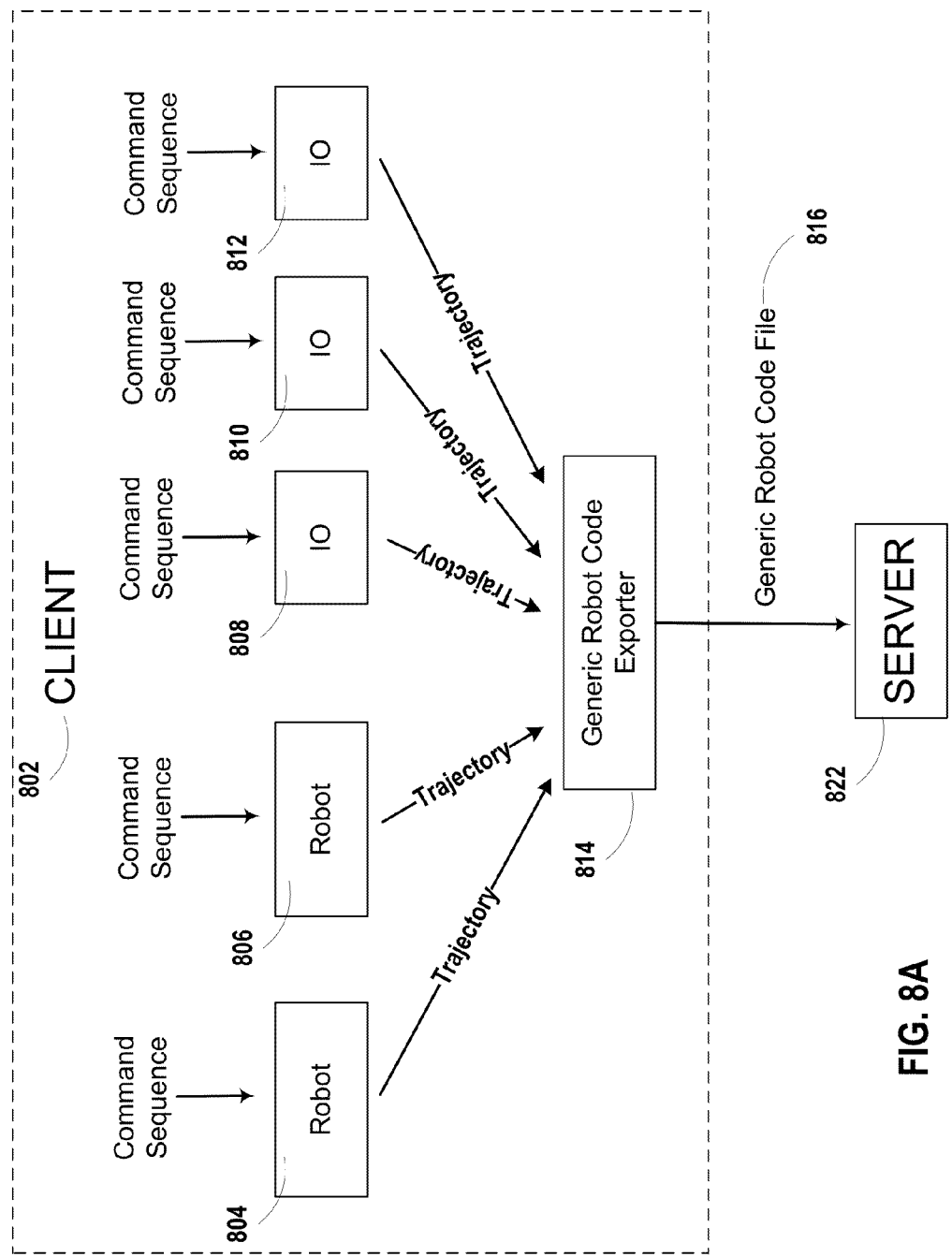
FIG. 8A illustrates a schematic view of a client and server, according to an example embodiment.

FIG. 8A shows a diagram of client-side generation of a digital representation of at least one digital robot actor, according to an example embodiment. In particular, a client 802 may be used to generate a generic robot code file describing motion commands and IO commands to command one or more robot actors within a workcell. Client 802 may include software control 26 and/or any of the other software authoring environments previously described. Within examples, client 802 may allow a user to create and sequence commands, including commands to move robot actors and activate IO devices, in order to design an automated robotic process, such as a manufacturing process.

A first robot actor 804 may be supplied with a first command sequence containing motion commands for the first robot actor 804 to execute movements within a workcell. Additionally, a second robot actor 806 may be supplied with a second command sequence containing motion commands for the second robot actor 806 to execute within the same workcell. The motion commands may indicate sequences of positions and orientations within a workcell in order to create trajectories for a robot's end effector to move through. In further examples, axes commands may also be used to move the robot actors 804, 806 along axes within the workcell as well or instead. In some examples, the commands may be sequential so that each robot executes its command sequence in order without reference to particular points in time. In other examples, the commands may be synchronized to a common clock or timeline. In further examples, a mix of sequence commands and time-based may be used.

In additional examples, command sequences may also be provided to create trajectories for IO devices 808, 810, 812. In some examples, IO devices 808, 810, 812 may include devices to activate end-effector-mounted tools on one of the robot actors. For example, an IO device may activate a gripper or a spindle mounted on a robot's end effector during a construction process. IO triggers may be sequenced to occur at particular points during a robot's movement through a motion path. In additional examples, some of the IO devices 808, 810, 812 may be standalone IO devices. For example, an IO trigger with a command sequence may be used to control the position of a turntable within the workcell. In other examples, an IO trigger may be used to command a work surface to actuate (e.g., to turn on a vacuum to hold material to a work surface). In further examples, an IO trigger may be used to send a cue to a different automation system (e.g., a legacy or external automation system that can receive a start cue or program cue). In yet further examples, an IO trigger may be used to command the system to publish data over a web socket.

In an example embodiment, the command sequences for robots 802, 804 may be generated as an ordered data tree of target frames (e.g., a list of lists containing non-uniform data). Trajectories or motion paths for the robots 802, 804 may be generated that preserve the data tree structure. Additionally, the data tree structure may be used to insert particular IO commands for IO devices 808, 810, 812 at particular points. Trajectories for the IO devices 808, 810, 812 may then be generated containing IO triggers to be used for IO devices mounted on the robots 802, 804 and/or for standalone IO devices.

The trajectories for robots 802, 804 and IO devices 806, 808, 810 may be used by generic robot code exporter 814 in order to create a generic robot code file 816. The robot code file 816 may contain robot definitions describing the robot actors 802, 804. For example, the robot definition for a particular robot actor may include the manufacturer of the robot, the model of the robot, the types of motion available to the robot (degrees of freedom, axes along which the robot can travel, etc.), and/or other parameters. Additionally, the robot definition may include one or more IO devices, such as IO device 806, 808, or 810, to be used by the particular robot. For example, the robot definition may include a VFD to be used by the robot actor in order to power a particular end-effector-mounted tool such as a spindle. In additional examples, the robot definition may also include an initial pose for the robot actor to take within a workcell. The pose of a robot may represent the origin of the robot in world space and may be used to transform world-space coordinates into robot-space coordinates.

The generic robot code file 816 may be sent to a server 822 in order to cause physical robots within a particular workcell to perform a process defined by the robot code file. In some examples, the file 816 may be sent (e.g., over a wireless or wired network connection) to the server 822 for immediate execution. In other examples, the robot code file may be stored and used at a later time in different workcells, such as workcells that contain different numbers and types of robotic devices and/or IO devices.

Figure 9:
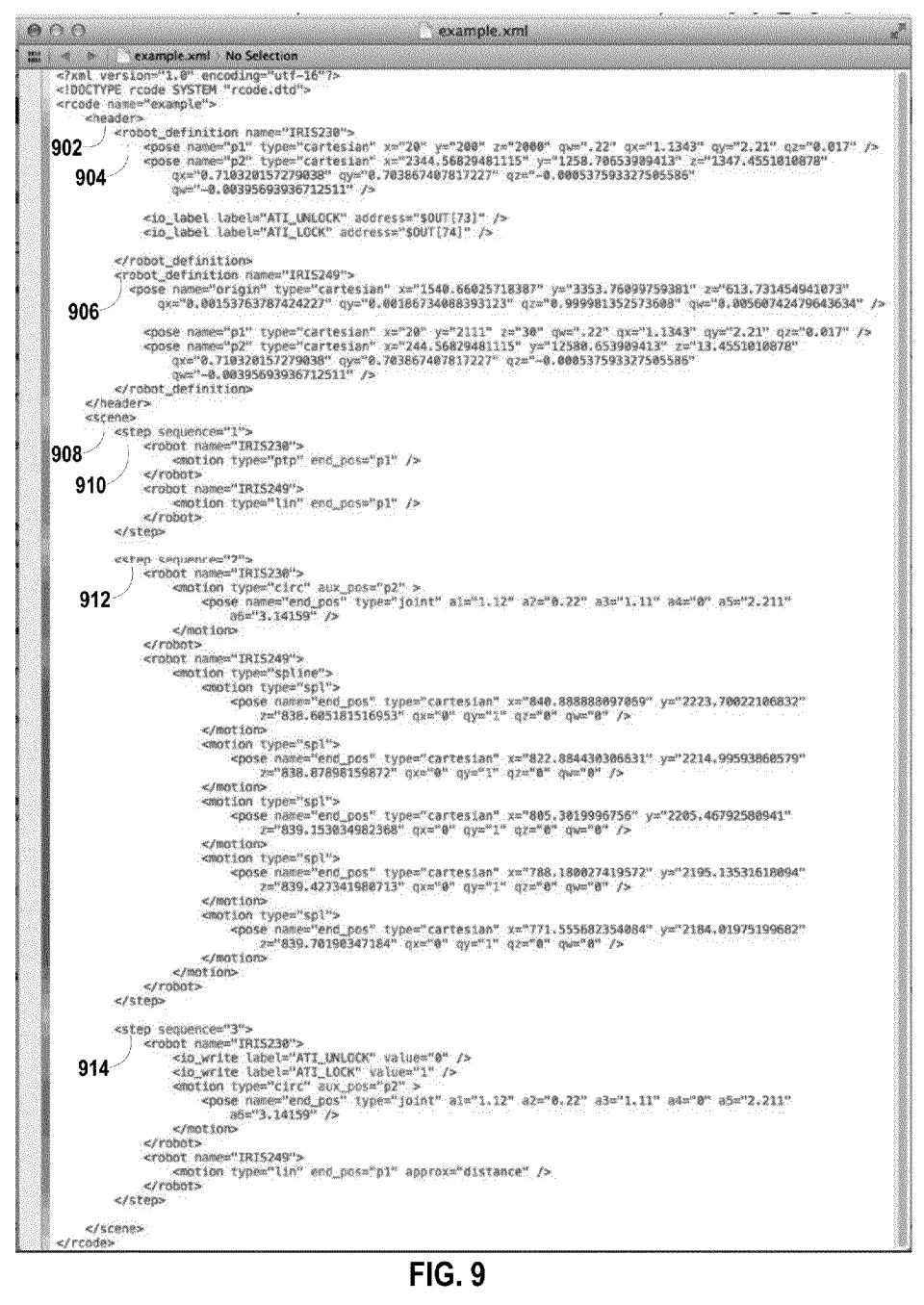

FIG. 9 shows an example of a generic robot code file. The file contains a header section 902 and a scene section 908. The header section 902 includes two robot definitions 904, 906 describing two digital robot actors. Each robot definition 904, 906 includes poses defining starting positions for the robots to take within a workcell. Additionally, the robot definition 904 includes IO labels that describe IO triggers to activate an IO device mounted on the robot actor. For example, the IO device could be used to cause a gripper on the robot device to grip or release in order to pick up and place materials or other objects within a workcell.

The scene section 908 may include one or more sequences of robot motions and/or IO triggers in order to cause robotic devices to effectuate a process within a workcell. For example, a first step sequence 910 may be used to cause the robot actors to move to an initial pose within the workcell. A second step sequence 912 may contain a sequence of motion commands to be performed by each of the digital robots defined by robot definitions 904, 906. A third step sequence 914 may include IO triggers in order to activate an IO device used by the digital robot defined by robot definition 904 in addition to motion commands for both of the robot actors. Additional or more complex sequences of robot motions, IO triggers, and/or axis motions could be included within a generic robot code file as well.

As shown in FIG. 9, a number of different types of motion commands may be supported by the generic robot code format. In one example, robot motion commands may be abstracted into joint, cartesian, curve, and circular motions. A joint motion may be a motion within joint space, where a robot motion planner calls for the joints of the robot to rotate from their position at a first step to a different position at a second step. A cartesian motion may be a motion within cartesian space, where a robot motion planner calls for the end effector of the robot to move from its cartesian position at a first step to a cartesian position at a second step. A curve motion may be used to cause the end effector of a robot to follow a curved path at a constant velocity. A circular motion may be used to cause the end effector of a robot to make a smooth radial path about a pivot point. In some examples, motion commands may optionally include a maximum velocity and/or a maximum acceleration as parameters. In further examples, motion commands may also include parameters for declaration a relative motion versus an absolute motion. In yet further examples, motion commands may also include parameters for defining a method of approximating target poses.

In additional examples, a generic robot code file may provide support for synchronization of robot commands for different robot actors. For example, during a construction process, a first robot actor holding a board may be instructed to maintain its position until a second robot actor that is commanded to nail the board onto a wall is finished driving the nail into the board. In order to synchronize robot operations, individual steps, such as those shown in FIG. 9, may be used. For example, all of the robots may be required to finish their assigned operations within a particular step before moving on to the next step. Accordingly, the start of each step within the file may serve as a sync point requiring an interlock between robotic actors. The command sequences for each of the robots may therefore be synchronized before each step within the generic robot code file is started by all of the robots.

In other examples, sync points may be used to send and receive cues to and from external automation systems. For example, a generic robot code file may contain instructions to cause robot actors to execute a performance, such as an audio-visual performance. Sync points may cue particular part of the performance that involve external systems (e.g., a scrim dropping, a cart of drummers rolling on stage, or an audio system to start a musical sequence).

In further examples, a generic robot code file may provide support for higher-level controllers that may receive information from robot actors and/or other devices within a workcell. For example, the file may contain conditional commands that depend on a particular state of a robot actor or a sensor value of a sensor within the workcell. Depending on the state of the robot actor or the sensor value, different motion commands and/or IO commands may be executed. For example, if the value of a sensor equals a particular value, a robot actor may be moved to a certain position and an IO trigger may be activated. Alternatively, if the value of the sensor does not equal the particular value, the robot actor may be moved to a different position and a different IO trigger may be activated. In further examples, a variety of different types of commands to handle program flow control may be used as well (e.g., case switching, if/then, for loops, while loops, etc.).

In other examples, a generic robot code file may provide support for parallel execution of robot operations in addition to or instead of sequential execution. In one example, parallel execution may include time-based robot operations. For example, a time-based section of code may define robot motion as position, velocity, and/or acceleration curves over a global timeline using a certain timestep resolution. For example, if the timestep resolution is 12 milliseconds, precise robot motion parameters (position, velocity, and/or acceleration) may be defined for each robot actor every 12 milliseconds. In further examples, IO triggers may additionally be defined at particular points in time along the global timeline instead of as sequential events.

In further examples, a single robot code file may contain sections that contain sequential robot operations as well as sections that contain time-based robot operations. For example, the first 50% of a robot code file may contain operations to be executed sequentially, the next 10% of the file may contain operations to be executed in a time-based mode, and the final 40% of the file may contain additional operations to be executed sequentially. In some examples, the file may contain annotations or flags to indicate whether the operations are to be performed sequentially or in a time-based mode. In further examples, different parameters may be included within each type of section. For example, a time-based section of code may include a timestep resolution indicating a timestep resolution expected by a robot controller. The same time-based instructions may then be compiled to different robot controllers expecting different timestep resolutions.

In additional examples, parallel execution may involve different modes operation instead of or in addition to time-based operation. For example, instead of using a global timeline to model simultaneous operation of multiple robotic devices, a different reference construct may be used. In one example, torque driven, inertial modeling may be used to model movements and operations of a plurality of robotic devices. In such an example, operations may be executed by multiple devices in parallel without reference to time while still providing for parallel execution within a workcell (e.g., by using inertial modeling to prevent collisions between devices).

Method 700 may additionally include determining a mapping between the digital robot actors and physical robot actors within a physical workcell, as shown by block 704. In particular, the mapping may indicate which physical robot actor will perform operations assigned to a particular digital robot actor. In some examples, validation procedures may be used in order to validate that the robotic devices within a particular workcell are capable of performing the robot instructions within a generic robot code file (e.g., that the workcell contains robotic devices with the necessary parameters/capabilities). In other examples, IO devices and/or other types of hardware devices may also be mapped firm digital representations within the generic robot code file to physical counterparts within a physical workcell.

Figure 8B:
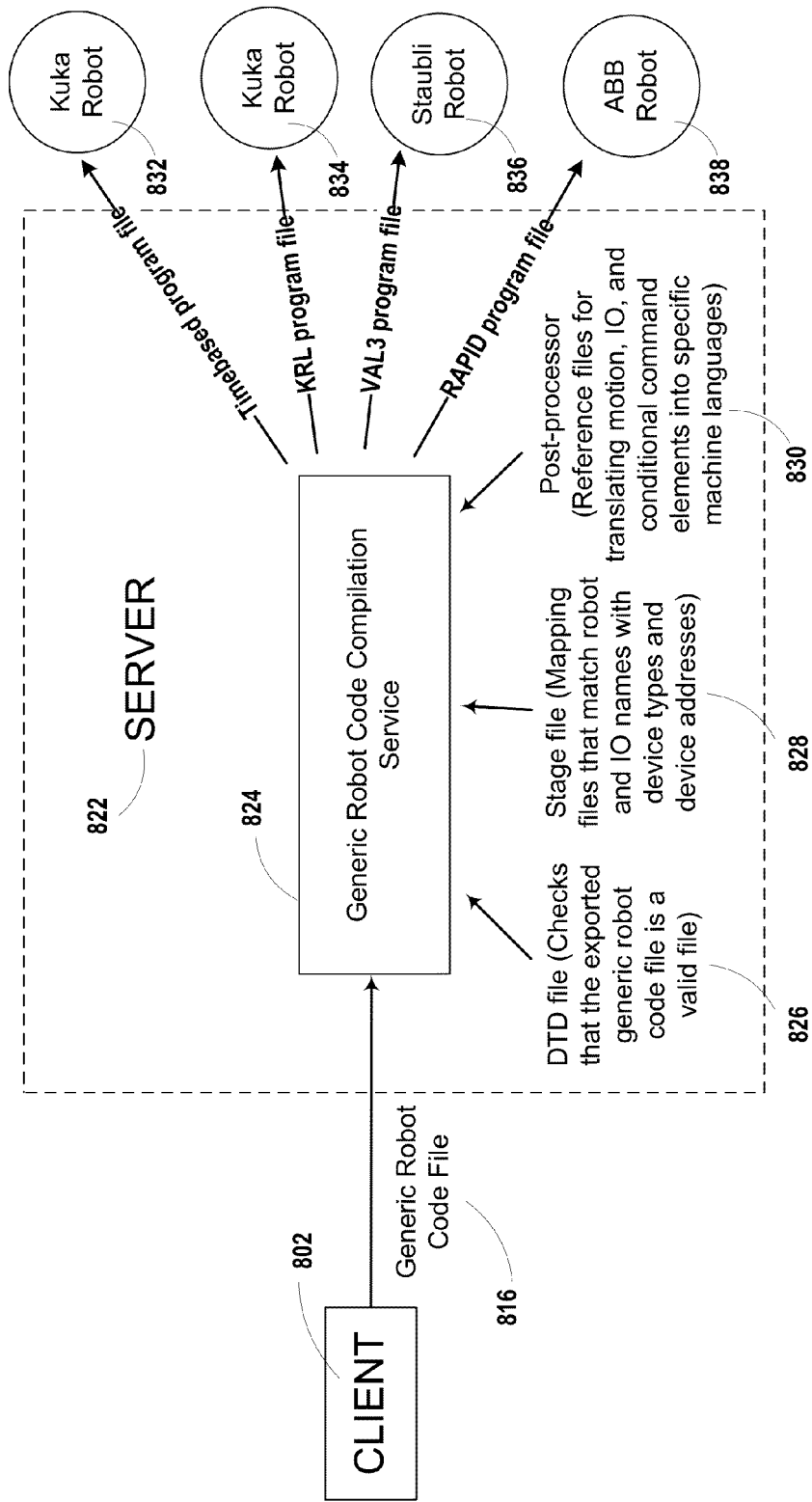
FIG. 8B illustrates another schematic view of a client and server, according to an example embodiment.

FIG. 8B shows a diagram of server side processing of a generic robot code file, according to an example embodiment. In particular, a server 822 may receive a generic robot code file 816 from a client 802, which may have been generated using software as previously discussed. The server 822 may use a generic robot code compilation service 824 to process the generic robot code file 816. In some examples, the generic robot code compilation service 824 may include programming instructions and/or executable files or program code existing on a control system, such as a master control 10 as described with respect to FIG. 1, or a different control system.

In some examples, the generic robot code compilation services 824 may include a document type definition (DTD) file 826 in order to check the validity of a received generic robot code file. For example, the DTD file 826 may be used to verify that a particular generic robot code file contains a header section, a scene, at least one defined robot actor, and at least one sequence of robot operations for the robot actor to execute. Other components or aspects of generic robot code files may be checked as well. In some examples, an error may be generated and the system may stop processing if an invalid file is detected.

In additional examples, the generic robot code compilation service 824 may also include a stage file 828. The stage file 828 may contain a description of available robotic devices and/or other hardware components within a workcell. In some examples, the stage file 828 may be used to generate a mapping between digital robot actors from a generic robot code file and physical robot actors within the workcell. For instance, the stage file 828 may include types of robot actors and parameters describing operational characteristics of robot actors in order to match physical robots in a workcell to previously defined digital robots. In further examples, the stage file 828 may also be used to validate that the physical robot actors in a workcell can perform the assigned robot operations.

In additional examples, other components in a workcell may be defined and/or described within a stage file in addition to or instead of robot actors. For example, IO devices, including end-effector-mounted devices and/or standalone IO devices, may also be defined within a stage file. In other examples, other hardware components, such as physical tools, a tool rack, and/or one or more types of sensors may also be defined within a stage file. The descriptions of additional components may be used to additionally map IO devices and other components from digital representations within a generic robot code file to the physical world.

Method 700 may further include generating robot-language-specific sequences of executable instructions for the physical robot actors, as shown by block 706. In particular, the sequences of robot operations assigned to digital robot actors may be converted into robot-language-specific executable instructions to enable a variety of different types of robots (e.g., different manufacturers, makes, models, or types) to perform the operations. In some examples, the conversion may be completed using a post-processor residing on a control system, such as master control 10 described with respect to FIG. 1.

Referring again to FIG. 8B, generic robot code compilation service 824 may also include a post-processor 830 containing reference files in order to convert motion commands, IO commands, and/or conditional commands into specific machine languages. The stage file 828 may also include information about the types of robots and/or IO devices within a workcell in order to determine which reference file to use to convert a particular command sequence. For example, the generic robot code compilation service 824 may determine that a particular physical robot within a workcell is a Kuka robot requiring robot language Kuka KRL using stage file 828. Machine files containing syntax corresponding to different types of robot machine languages and/or manufacturers may be generated with commands corresponding to the commands within a generic robot code file.

In further examples, generic robot code compilation service 824 may additionally determine whether command sequences are sequential command sequences or time-based command sequences. In some examples, different syntax or parameters may be required in order for particular robot actors or IO devices to execute command sequentially versus at points along a global timeline. Accordingly, in addition to generating robot-language-specific instructions, generic robot code compilation service 824 may also create machine code files that provide support for sequential or time-based execution as needed.

Method 700 may additionally include transmitting the executable instructions to the physical robot actors to perform the robot operations within the physical workcell, as shown by block 708. In particular, once machine code files are generated, they may be pushed onto the robot controllers for specific robot actors and/or onto other types of controllers within the physical workcell. In some examples, the machine code files may be exported to the controllers all at once, while in other examples, they may be exported in sections or stages.

A physical workcell may contain a variety of different types of robot actors. A generic robot code file may be used to program robots from multiple manufacturers within a single software environment and control the robots via a shared hardware environment. Referring again to FIG. 8B, a physical workcell may contain robots from a number of different robot manufacturers, including a first Kuka robot 832, a second Kuka robot 834, a Staubli robot 836, and an ABB robot 838. As shown, each robotic device may be provided with a different type of machine language program file in a format that can be executed by the robotic device. In some examples, a mix of time-based and sequential program files may be exported as well.

In further examples, different types of robot actors can be substituted in a generic robot code file without having to program new sets of instructions for the robots. For example, the generic robot code compilation service 824 may cross-reference robot and IO definitions within the header section of a generic robot code file with the physical robot and IO device descriptions located within stage file 828. Updated machine program files may then be created for the physical robot devices after changing the description of the physical devices. Using this template approach, different robot geometry or types of hardware can be substituted without additional work.

Figure 10:
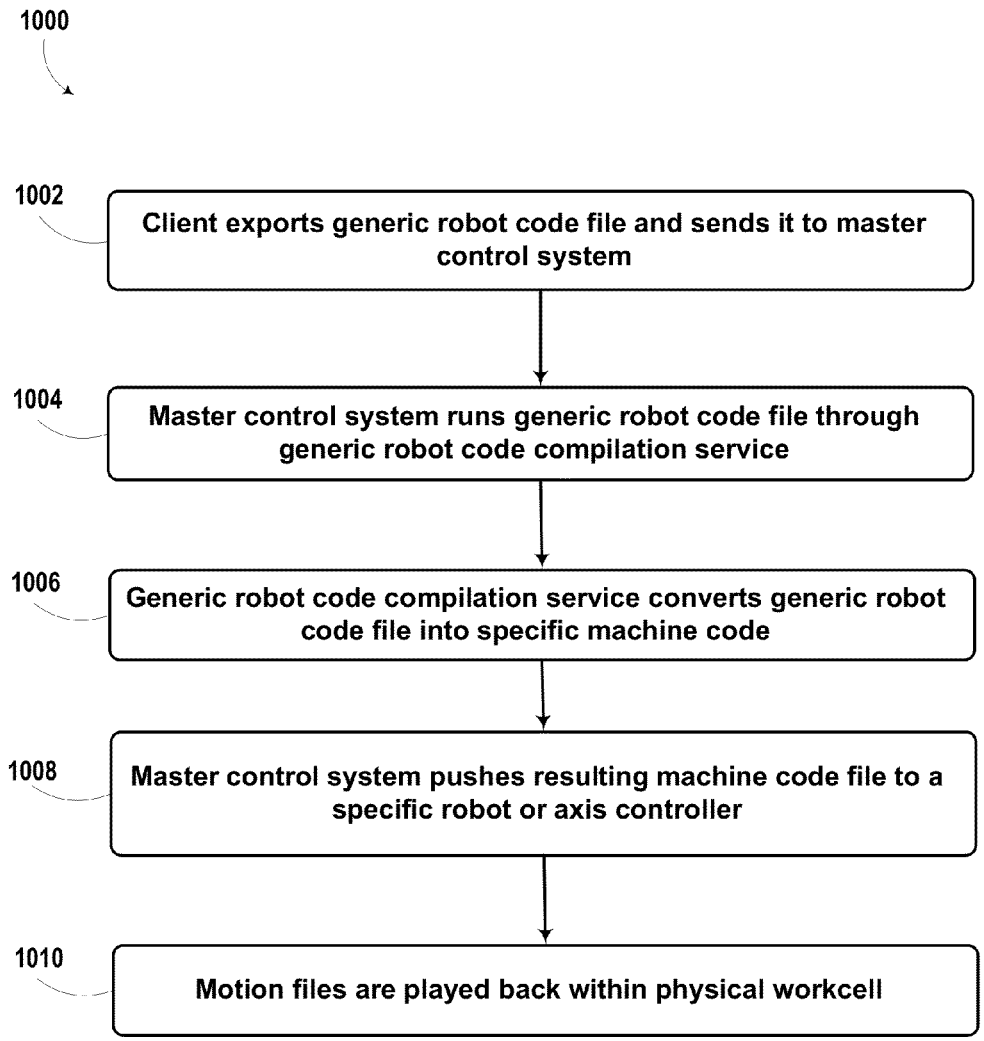
FIG. 10 is a flow chart of functions used by an example system, according to an example embodiment.

FIG. 10 is an example flow chart of functions that may be used by the systems described herein. As shown by block 1002, a client may first export a generic robot code file. In some examples, the generic robot code file may be generated by a software system, such as a software system for authoring a robotic manufacturing process as previously described. The generic robot code file may then be sent to a master control system. The master control system may be a hardware controller that communicates with robot actors and other pieces of hardware within a physical workcell, such as to control the manufacturing process during runtime.

As shown by block 1004, the master control system may then run the generic robot code file through a generic robot code compilation service. In some examples, the generic robot code compilation service may perform functions to validate that the robot code file is correctly formatted and that the physical robot actors within a workcell are capable of performing the robot operations contained within the file. Additionally, a mapping between digital robot actors within the robot code file and physical robot actors within the workcell may be determined in order to determine which physical robot actor will perform which set of robot operations.

As shown by block 1006, the generic robot compilation service may then convert the generic robot code file into specific machine code for the robotic and/or hardware devices within a workcell. A convertor may determine robot-language-specific instructions for individual devices in the workcell that cause the devices to perform the sets of operations defined by the generic robot code file. In some examples, a number of different types of machine code instruction sets may be generated, possibly including a mix of sequential and parallel execution modes.

As shown by block 1008, the master control system may then push the resulting machine code files onto specific robot controllers. In some examples, the machine code files may be generated during a first time period and then transmitted to the robots in the workcell during a second time period. In other examples, the machine code may be transmitted shortly before or during runtime of the robotic process. In some examples, machine code may also be sent to axes controllers in order to cause robotic devices to move along axes within the workcell. In additional examples, machine code may also be sent to IO devices in order to trigger IO events during the robotic process as well.

As shown by block 1010, the machine code files (including instructions for robot motions and IO events) may then be played back within the physical workcell. Controllers running on each robot actor and/or other hardware device may execute the machine code received from the master control system in order to effectuate a robotic process, such as a manufacturing process within the workcell. In further examples, the process may be repeated in other workcells containing other types of devices to repeat the same robotic process using the same generic robot code file.

VII. Conclusion

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the ladder diagrams, scenarios, and flow charts in the figures and as discussed herein, each block and/or communication may represent a processing of information and/or a transmission of information in accordance with example embodiments. Alternative embodiments are included within the scope of these example embodiments. In these alternative embodiments, for example, functions described as blocks, transmissions, communications, requests, responses, and/or messages may be executed out of order from that shown or discussed, including substantially concurrent or in reverse order, depending on the functionality involved. Further, more or fewer blocks and/or functions may be used with any of the ladder diagrams, scenarios, and flow charts discussed herein, and these ladder diagrams, scenarios, and flow charts may be combined with one another, in part or in whole.

A block that represents a processing of information, such as a block of method 1100 described above, may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claim.

What is claimed is:

1. A computer-implemented method, comprising:
   receiving, by a computing device, a digital representation of at least one digital robot actor, wherein the digital representation comprises:
   (a) at least one robot definition corresponding to the at least one digital robot actor, wherein the at least one robot definition comprises at least one input-output ("IO") device operable by the at least one digital robot actor, and
   (b) data indicating at least one sequence of robot operations for the at least one digital robot actor, wherein the at least one sequence of robot operations for a digital robot actor comprises a plurality of robot movements and a plurality of IO triggers to activate one or more of the at least one IO device;

determining, by the computing device, a mapping between the at least one digital robot actor and at least one corresponding physical robot actor within a physical workcell;

generating, by the computing device, at least one robot-language-specific sequence of executable instructions for the at least one physical robot actor based on the at least one sequence of robot operations for the at least one corresponding digital robot actor; and transmitting the at least one robot-language-specific sequence of executable instructions to the at least one physical robot actor to execute in order to perform the at least one sequence of robot operations within the physical workcell.

2. The method of claim 1, wherein the at least one robot definition further comprises at least one initial robot pose corresponding to the at least one digital robot actor, and wherein the method further comprises:

transmitting instructions to the at least one physical robot actor to execute the at least one robot-language-specific sequence of executable instructions based a transformation from the initial robot pose of the at least one corresponding digital robot actor.

3. The method of claim 1, wherein the plurality of IO triggers cause one of the at least one physical robot actor to operate an end-effector-mounted tool within the physical workcell.

4. The method of claim 1, wherein determining the mapping between the at least one digital robot actor and the at least one corresponding physical robot actor comprises validating that the at least one physical robot actor is capable of performing the at least one sequence of robot operations.

5. The method of claim 4, wherein validating that the at least one physical robot actor is capable of executing the at least one sequence of robot operations comprises identifying at least one available physical robot actor that is capable of performing the at least one sequence of robot operations based on a stage file, wherein the stage file describes the available physical robot actors within the physical workcell.

6. The method of claim 1, wherein determining the mapping between the at least one digital robot actor and the at least one corresponding physical actor comprises:

causing a dropdown menu to be displayed on a display screen of a second computing device, wherein the dropdown menu comprises a listing of available physical robot actors within the physical workcell; and receiving from the second computing device a selection of one or more of the available physical robot actors to use in the mapping.

7. The method of claim 1, wherein the digital representation of the at least one digital robot actor further comprises one or more sync points, wherein a sync point corresponds to a robot operation within each of the at least one sequence of robot operations; and wherein the method further comprises:

transmitting instructions to the at least one physical robot actor to hold position before performing a robot operation corresponding to a particular sync point until each of the at least one physical robot actor reaches a robot operation corresponding to the particular sync point.

8. The method of claim 1, wherein the at least one sequence of robot operations comprises one or more conditional operations that depend on an operational state of the at least one digital robot actor, and wherein the method further comprises:

transmitting instructions to the at least one physical robot actor to perform the one or more conditional operations according to the operational state of at least one physical robot actor within the physical workcell that corresponds to the at least one digital robot actor.

9. The method of claim 1, wherein the digital representation of the at least one robot actor further comprises at least one digital sensor, wherein the at least one sequence of robot operations comprises one or more conditional operations that depend on a sensor state of the at least one digital sensor, and wherein the method further comprises:

transmitting instructions to the at least one physical robot actor to perform the one or more conditional operations according to a sensor state of at least one physical sensor within the physical workcell that corresponds to the at least one digital sensor.

10. The method of claim 1, wherein the digital representation of the at least one robot actor further comprises at least one sequence of IO triggers for at least one digital standalone IO device; and wherein the method further comprises:

determining a mapping between the at least one digital standalone IO device and at least one physical standalone IO device within the physical workcell; and transmitting instructions to the at least one physical standalone IO device to perform the at least one sequence of IO triggers within the physical workcell.

11. The method of claim 1, wherein the digital representation of the at least one robot actor further comprises a plurality of time-based robot operations for the at least one digital robot actor, wherein the time-based robot operations correspond to times within a global timeline; and wherein the method further comprises:

generating a plurality of time-based, robot-language-specific executable instructions for the at least one physical robot actor based on the plurality of time-based robot operations for the at least one corresponding digital robot actor; and transmitting the plurality of time-based, robot-language-specific executable instructions to the at least one physical robot actor to execute in order to perform the time-based robot operations within the physical workcell at the corresponding times within the global timeline.

12. A system, comprising:

at least one physical robot actor; and a control system configured to:

receive a digital representation of at least one digital robot actor, wherein the digital representation comprises:

(a) at least one robot definition corresponding to the at least one digital robot actor, wherein the at least one robot definition comprises at least one input-output ("IO") device operable by the at least one digital robot actor; and (b) at least one sequence of robot operations for the at least one digital robot actor, wherein a sequence of robot operations for a digital robot actor comprises a plurality of robot movements and a plurality of IO triggers to activate one or more of the at least one IO device;

determine a mapping between the at least one digital robot actor and the at least one physical robot actor;

generate at least one robot-language-specific sequence of executable instructions for the at least one physical robot actor based on the at least one sequence of robot operations for the at least one digital robot actor; and transmit the at least one robot-language specific sequence of executable instructions to the at least one physical robot actor to execute in order to perform the at least one sequence of robot operations.

13. The system of claim 12, wherein the at least one robot definition further comprises at least one initial robot pose corresponding the at least one digital robot actor, and wherein the control system is further configured to:
transmit instructions to the at least one physical robot actor to execute the at least one robot-language-specific sequence of executable instructions based on a transformation from the initial robot pose of the at least one corresponding digital robot actor.

14. The system of claim 12, wherein the control system is configured to determine the mapping between the at least one digital robot actor and the at least one physical robot actor by identifying at least one available physical robot actor that is capable of performing the at least one sequence of robot operations based on a stage file, wherein the stage file describes the available physical robot actors within a physical workcell.

15. The system of claim 12, wherein the digital representation of the at least one digital robot actor further comprises one or more sync points, wherein a sync point corresponds to a robot operation within each of the at least one sequence of robot operations; and wherein the control system is further configured to:
transmit instructions to the at least one physical robot actor to hold position before performing a robot operation corresponding to a particular sync point until each of the at least one physical robot actor reaches a robot operation corresponding to the particular sync point.

16. The system of claim 12, wherein the digital representation of the at least one digital robot actor further comprises a plurality of time-based robot operations for the at least one digital robot actor, wherein the time-based robot operations corresponds to times within a global timeline; and wherein the control system is further configured to:
generate a plurality of time-based, robot-language-specific executable instructions for the at least one physical robot actor based on the plurality of time-based robot operations for the at least one corresponding digital robot actor, and
transmit instructions to the least one physical robot actor to execute the plurality of time-based, robot-language-specific executable instructions in order to perform the time-based robot operations at the corresponding times within the global timeline.

17. A non-transitory computer readable medium having stored therein instructions executable by a computing device to cause the computing device to perform functions comprising:
receiving, by a computing device, a digital representation of at least one digital robot actor, wherein the digital representation comprises:
(a) at least one robot definition corresponding to the at least one digital robot actor, wherein the at least one robot definition comprises at least one input-output ("IO") device operable by the at least one digital robot actor, and
(b) data indicating at least one sequence of robot operations for the at least one digital robot actor, wherein the at least one sequence of robot operations for a digital robot actor comprises a plurality of robot movements and a plurality of IO triggers to activate one or more of the at least one IO device;
determining, by the computing device, a mapping between the at least one digital robot actor and at least one corresponding physical robot actor within a physical workcell;
generating, by the computing device, at least one robot-language-specific sequence of executable instructions for the at least one physical robot actor based on the at least one sequence of robot operations for the at least one corresponding digital robot actor, and
transmitting the at least one robot-language-specific sequence of executable instructions to the at least one physical robot actor to execute in order to perform the at least one sequence of robot operations within the physical workcell.

18. The non-transitory computer readable medium of claim 17, wherein the digital representation of the at least one digital robot actor further comprises one or more sync points, wherein a sync point corresponds to a robot operation within each of the at least one sequence of robot operations; and wherein the medium further comprises instructions, that when executed by the computing device, cause the computing device to perform a function comprising:
transmitting instructions to the at least one physical robot actor to hold position before performing a robot operation corresponding to a particular sync point until each of the at least one physical robot actor reaches a robot operation corresponding to the particular sync point.

19. The non-transitory computer readable medium of claim 17, wherein the digital representation of the at least one digital robot actor further comprises at least one digital sensor, wherein the at least one sequence of robot operations comprises one or more conditional operations that depend on a sensor state of the at least one digital sensor, and wherein the medium further comprises instructions, that when executed by the computing device, cause the computing device to perform a function comprising:
transmitting instructions to the at least one physical robot actor to perform the one or more conditional operations according to a sensor state of at least one physical sensor within the physical workcell that corresponds to the at least one digital sensor.

20. The non-transitory computer readable medium of claim 17, wherein the digital representation of the at least one digital robot actor further comprises a plurality of time-based robot operations for the at least one digital robot actor, wherein the time-based robot operations corresponds to times within a global timeline; and wherein the medium further comprises instructions, that when executed by the computing device, cause the computing device to perform functions comprising:
generating a plurality of time-based, robot-language-specific executable instructions for the at least one physical robot actor based on the plurality of time-based robot operations for the at least one corresponding digital robot actor; and
transmitting the plurality of time-based, robot-language-specific executable instructions to the at least one physical robot actor to execute in order to perform the time-based robot operations within the physical workcell at the corresponding times within the global timeline.

* * * * *